(12) United States Patent
Welch et al.

(10) Patent No.: US 10,192,854 B2
(45) Date of Patent: Jan. 29, 2019

(54) LIGHT EMITTER COMPONENTS AND RELATED METHODS

(71) Applicant: Cree, Inc., Durham, NC (US)

(72) Inventors: Erin R. F. Welch, Chapel Hill, NC (US); Colin Kelly Blakely, Franklinton, NC (US); Jesse Colin Reiherzer, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/192,790

(22) Filed: Jun. 24, 2016

(65) Prior Publication Data
US 2017/0373045 A1 Dec. 28, 2017

(51) Int. Cl.
*H01L 25/075* (2006.01)
*H01L 33/60* (2010.01)
*H01L 33/56* (2010.01)
*H01L 33/62* (2010.01)
*H01L 23/538* (2006.01)

(52) U.S. Cl.
CPC ...... *H01L 25/0753* (2013.01); *H01L 23/5386* (2013.01); *H01L 33/56* (2013.01); *H01L 33/60* (2013.01); *H01L 33/62* (2013.01)

(58) Field of Classification Search
CPC . H01L 25/0753; H01L 23/5386; H01L 33/56; H01L 33/60; H01L 33/62
USPC ...................................... 257/98, 89
See application file for complete search history.

(56) References Cited

U.S. PATENT DOCUMENTS

| 7,213,940 | B1 | 5/2007 | Van De Ven et al. |
| 2009/0050907 | A1* | 2/2009 | Yuan ............... H05B 33/0821 257/88 |
| 2010/0140633 | A1 | 6/2010 | Emerson |
| 2012/0193649 | A1* | 8/2012 | Donofrio ............ H01L 25/0753 257/88 |
| 2012/0193662 | A1* | 8/2012 | Donofrio ............... H01L 33/60 257/98 |
| 2013/0341634 | A1 | 12/2013 | Heikman et al. |
| 2014/0346533 | A1* | 11/2014 | Andrews ............ H01L 25/0753 257/88 |
| 2015/0062915 | A1* | 3/2015 | Hussell ..................... F21V 7/22 362/296.01 |
| 2015/0179903 | A1* | 6/2015 | Pun ........................ H01L 33/54 257/88 |

(Continued)

*Primary Examiner* — Cuong Q Nguyen
*Assistant Examiner* — Tong-Ho Kim
(74) *Attorney, Agent, or Firm* — Jenkins, Wilson, Taylor & Hunt, P.A.

(57) ABSTRACT

Light emitter components and related methods are provided. In some aspects, light emitter components and related methods include a ceramic submount having a reflective surface. Light emitter components and related methods can include light emitter chips disposed over the reflective surface. Each light emitter chip can include a sapphire substrate, an epi area disposed over the sapphire substrate, and first and second electrical contacts disposed over the epi area. The first and second electrical contacts may face the reflective surface. A ratio between a combined epi area of the plurality of light emitter chips and a surface area of the reflective surface may be at least 0.4 or more, and a ratio between a combined planar surface area of the plurality of light emitter chips and a planar surface area of the reflective surface may be at least approximately 0.25 or more.

23 Claims, 15 Drawing Sheets

(56) References Cited

U.S. PATENT DOCUMENTS

2015/0345714 A1* 12/2015 Reiherzer ............... H01L 33/50
362/235
2015/0349218 A1* 12/2015 Reiherzer ............... H01L 33/56
257/88
2016/0161098 A1 6/2016 Tudorica et al.

* cited by examiner

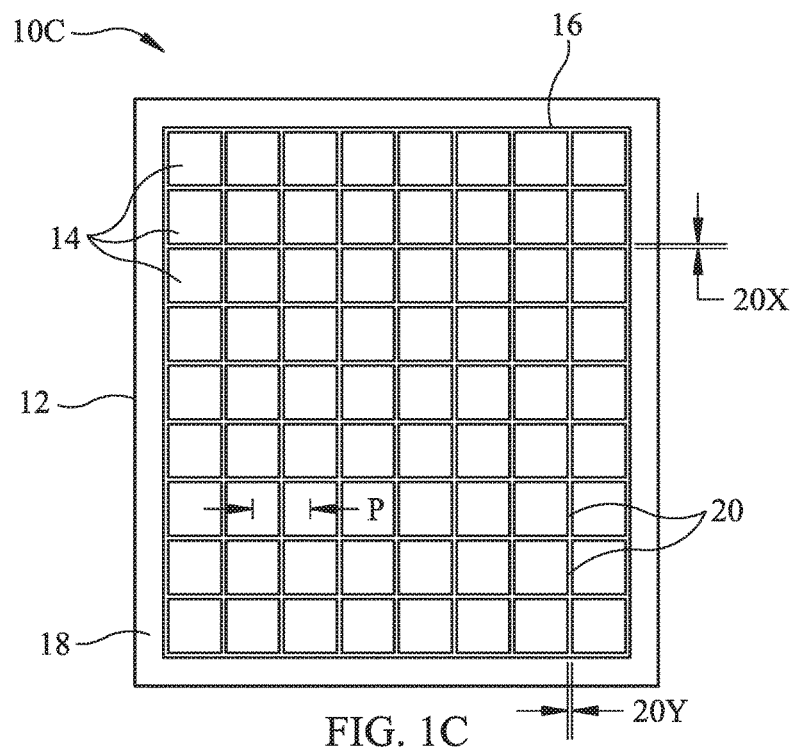
FIG. 1C
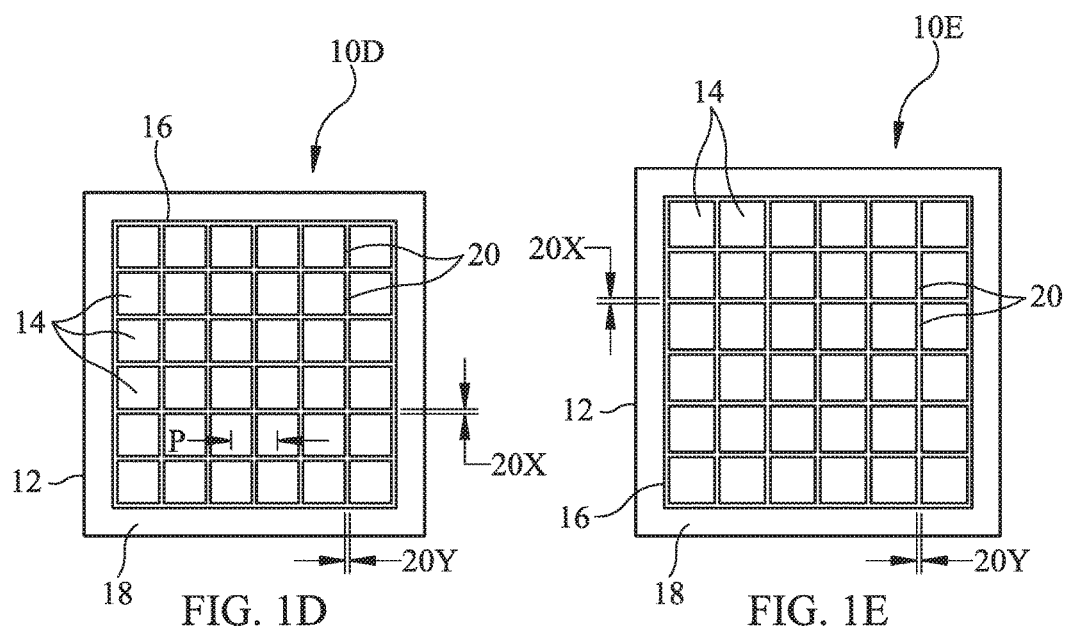
FIG. 1D
FIG. 1E

US 10,192,854 B2

LIGHT EMITTER COMPONENTS AND RELATED METHODS

TECHNICAL FIELD

The subject matter herein relates to light emitters, such as light emitting diode (LED) chips. More particularly, the subject matter herein relates to light emitter components and methods comprising one or more arrays of LED chips and related methods.

BACKGROUND

Light emitter chips, such as light emitting diode (LED) chips are solid state devices that convert electrical energy into light, and generally comprise one or more active layers of semiconductor material sandwiched between (e.g., vertically or horizontally) oppositely doped layers. When a bias is applied across the oppositely doped layers, holes and electrons are injected into the active layer where they recombine and generate light. Light is emitted from the active layer and multiple surfaces of the LED chip.

The active layer may be epitaxially formed on a substrate, such as a silicon (Si), silicon carbide (SiC), sapphire, gallium arsenide (GaAs), gallium nitride (GaN), etc., growth substrate, however, the completed device may or may not necessarily include the growth substrate. The diode region may be fabricated from non-organic or organic semiconductor-based materials. The light radiated by the LED chip may be in the visible or ultraviolet (UV) regions, and the LED chip may be used in conjunction with wavelength conversion material, such as phosphor(s) or lumiphor(s).

LED chips are increasingly being used in lighting/illumination products and applications, with a goal of providing a replacement for incandescent and fluorescent lighting. To accomplish the goal of replacing traditional lighting components with LED lighting components, LED lighting designers are faced with stringent dimensional, energy efficiency, and luminous flux output requirements. Such requirements have resulted in designers providing LED chips in arrays of various sizes and/or shapes.

Conventional LED products that utilize one or more LED arrays may require wire bonds to electrically connect the chips. The use of wire bonds in an array of chips is problematic, as wire bonds create a constraint on the density at which an array of chips can be provided. Wire bonds are also problematic in terms of blockage or absorption of light, as the metallic materials forming the wire bonds interfere with light. In some aspects, the wire bonds connecting to two topside contacts (e.g., two bond pads on a top surface), result in about a 1% to 2% loss in luminous flux per chip.

Providing SiC based chips in an array may add additional challenges, as SiC is light-absorptive and can result in blockage and/or absorption of light when adjacent chips are spaced too close. Thus, SiC chips also create a constraint on the density at which chips can be provided in an array. Beveling the sides of the chips may alleviate some of the absorption problems as beveling allows more light to escape the substrate, however; beveling can create more sideways emission that may then be absorbed by the SiC of a neighboring chip that is closely spaced. In some aspects, beveling the sides and/or crowding effects (e.g., the chips spaced too closely together) result in about a 1% loss in luminous flux per chip.

Accordingly, and despite the availability of various products in the marketplace, a need remains for brighter, more efficient, and more cost-effective LED components and/or methods, which make it easier for end-users to justify switching to LED products from a return on investment or payback perspective.

SUMMARY

In accordance with this disclosure, light emitter components and related methods having improved performance are provided and described herein. An exemplary light emitter component comprises a submount and a reflective material disposed over portions of the submount. The reflective material comprises a reflective surface. The light emitter component further comprises a plurality of, such as two or more, light emitter chips disposed over the reflective surface, wherein each light emitter chip comprises a sapphire substrate. Each chip may include an epi area disposed over the sapphire substrate, and first and second electrical contacts disposed over the epi area. The first and second electrical contacts may face the reflective surface. a ratio between A combined epi area of the plurality of light emitter chips and a surface area of the reflective surface is at least 0.4 or more, and wherein a ratio between a combined planar surface area of the plurality of light emitter chips and a planar surface area of the reflective surface is at least approximately 0.25 or more In some embodiments, the plurality of light emitter chips may occupy approximately 70% or more of the reflective surface for improved light extraction per component.

Another exemplary light emitter component comprises a ceramic submount, a reflective material disposed over the submount, and two or more light emitter chips. The reflective material comprises a reflective surface. The two or more light emitter chips are disposed over the reflective surface. In some aspects, each light emitter chip comprises a sapphire substrate, an epi area disposed over the sapphire substrate, and first and second electrical contacts disposed over the epi area. The first and second electrical contacts face the reflective surface. A ratio between the combined epi area of the two or more light emitter chips and a surface area of the reflective surface can be at least 0.4 or more and the two or more light emitter chips can be spaced apart by approximately 0.3 millimeters (mm) or less.

Another exemplary light emitter component comprises a submount, a reflective material disposed over the submount, a plurality of light emitter chips disposed over the submount, and a retention wall disposed around the plurality of light emitter chips. the retention wall is disposed over a first portion of the submount that is on a first side of the retention wall, a second portion of the submount that is on a second side of the retention wall and a third portion of the submount that is below the retention wall such that the reflective material contacts portions of the submount and the retention wall.

Light emitter components herein include a reflective material comprising a reflective surface. The plurality of light emitter chips can occupy approximately 50% or more of a surface area of the reflective surface. In some embodiments, the plurality of light emitter chips occupies approximately 70% or more of a surface area of the reflective surface.

Components herein may utilize an aluminum nitride (AlN) submount. The electrical traces and/or reflective material may directly contact the submount. Portions of the submount that is not covered with traces may be covered with reflective material. In some embodiments, the reflective material extends to outermost edges of the submount. In some embodiments, at least 75% of a planar surface of the submount is covered with the reflective material. In some embodiments, less than 5% of a planar surface area of the reflective surface is occupied by the plurality of electrical traces. Components herein have improved brightness and light extraction in some aspects, due to the reflective material. The reflective material may include a reflective plastic, a reflective polymer, reflective particles, or a solder mask material. The reflective material may be white.

In another exemplary embodiment, a light emitter component comprises a submount. The submount comprises a reflective surface and a plurality of light emitter chips are disposed over the reflective surface. A ratio of a combined planar surface area of the plurality of light emitter chips to a planar surface area of the reflective surface is at least approximately 0.25 or more. A retention structure can be disposed around the reflective surface and the plurality of light emitter chips. The retention structure can be configured as a substantially square shape in a planar view over the submount.

In some aspects, the ratio of the combined planar surface area of the plurality of light emitter chips to the planar surface area of the reflective surface is at least approximately 0.5 or more, at least 0.75 or more, or more than 0.8.

An exemplary method of providing a light emitting component is disclosed. The method comprises providing a submount comprising ceramic and providing a reflective material over portions of the submount. The reflective material can comprise a reflective surface. The method further comprises providing two or more light emitter chips over the reflective surface, wherein each light emitter chip comprises a sapphire substrate, an epi area disposed over the sapphire substrate, and first and second electrical contacts disposed over the epi area. In some aspects, the first and second electrical contacts face the reflective surface, and the plurality of light emitter chips may occupy approximately 70% or more of the reflective surface for improved light extraction per component.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly herein, including reference to the accompanying figures, in which:

FIGS. 1A-1E are top plan views illustrating light emitter components having arrays of LED chips according to the present subject matter;

DETAILED DESCRIPTION

Figure 1A:
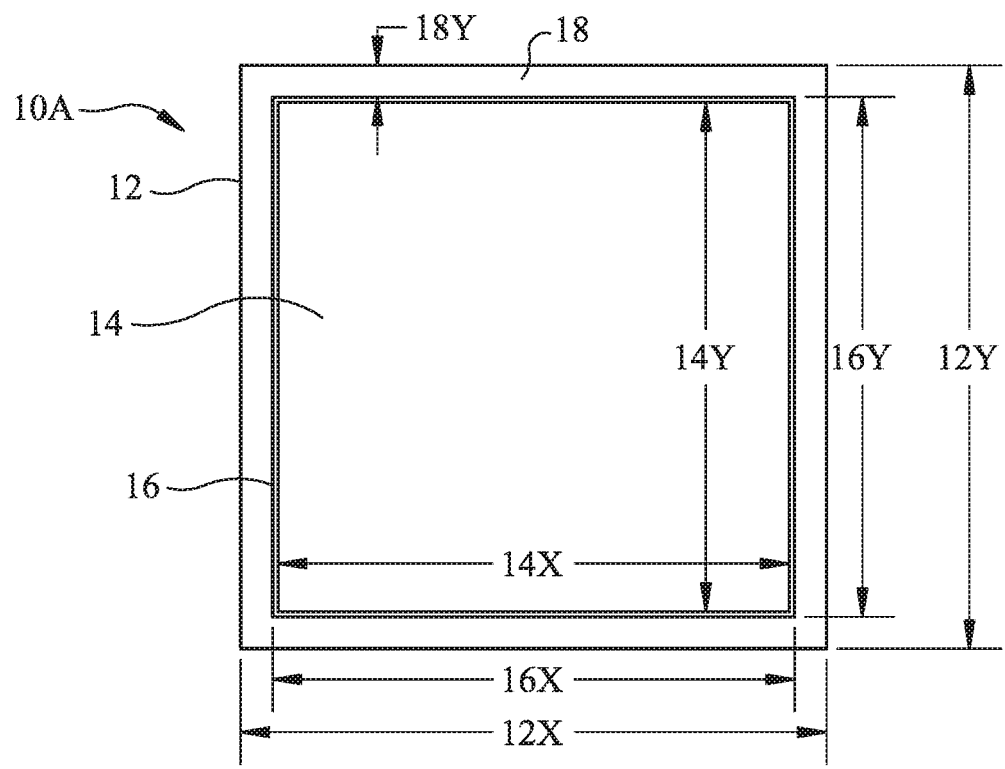

The subject matter disclosed herein is directed to light emitter components comprising one or more light emitting diode (LED) chips. The LED chips can be provided in a high density array over a reflective, light emitter surface (LES). LED components that incorporate arrays of LED chips described herein can exhibit improved lighting aspects, for example, improved efficiency, brightness, and/or light extraction at a lower cost than conventional components.

Notably, LED components such as those described herein can utilize one or more LED chips that can attach directly (direct attach chips) to an underlying component surface, which obviates the need for wires, wire bonds, or other types of wired connectors thereby resulting in tighter packing of the LED chips in an array. The tighter packing (e.g., a higher density) of LED chips in an array can improve light output, reliability, and efficacy of the product incorporating the array as described herein. LED components as described herein can also utilize sapphire based LED chips, which absorb less light than silicon (Si) or silicon carbide (SiC) based LED chips. Thus, LED arrays as described herein can be more dense (i.e., tighter packed), as adjacent chips have less area (less spacing) therebetween. The tighter packing results in LED arrays that are more dense in terms of epi regions (e.g., active areas of the chips that emit light) and are more tightly packed than previously thought to be achievable.

Reference will now be made in detail to exemplary embodiments of the subject matter described herein, examples of which are illustrated in the accompanying drawings. Wherever possible, the same reference numbers will be used throughout the figures, also "FIGS.", to refer to the same or like components. Each example is provided to explain the subject matter and not as a limitation. In fact, features illustrated or described as part of one embodiment can be used in another embodiment to yield still a further embodiment. It is intended that the subject matter disclosed and envisioned herein cover such modifications and variations.

As illustrated in the various figures, some sizes of structures or portions may be exaggerated relative to other structures or portions for illustrative purposes and, thus, are provided to illustrate the general structures of the present subject matter and may or may not be drawn to scale. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures were turned over, structure or portion described as "above" other structures or portions would now be oriented "below" the other structures or portions. Likewise, if the package or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein, the terms "LED populated area", "LED chip populated area", or other variations thereof, refer to an area (i.e., an area on the submount) the outer boundaries of which corresponds to the outermost edges of the outermost LED chips (of an LED chip array) in any direction.

As used herein, "light emitter surface", abbreviated "LES", and/or "reflective surface" refer to a surface that is reflective to light emitted by the LED chip or chips in the LED chip populated area. The outer boundaries of the LES (reflective surface) define a surface area that may reflect light in any direction. The LES can, but does not have to, comprise a surface of the submount that is below (e.g., underlying) the LED chips and/or on a different plane than the LED chips. In some aspects, the LES extends beyond the footprint of one or more LED chips and/or beyond outermost areas of LED chip populated area, so that the area of the LES is slightly larger than the LED populated area.

As used herein, "attaching" or "mounting", as used in regards to an LED chip, refer to the attachment of one or more horizontally structured LED chips to an underlying surface. The horizontally structured LED chips can have positive and negative electrical contacts disposed on a same side or surface (e.g., a bottom side or surface) of the LED chip, which are adapted to electrically communicate with electrically conductive portions of the underlying surface, which may include a submount or portions of a submount.

LED chips according to embodiments described herein can comprise group III-V nitride (e.g., gallium nitride (GaN)) based LED chips or lasers that are fabricated on a sapphire growth substrate. The sapphire growth substrate may be present in the final structure of the chip, or it may be removed during fabrication. Fabrication of LED chips is generally known and only briefly described herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with one mole of the Group III elements. Accordingly, formulas such as $Al_xGa_{(1-x)}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original growth substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., sapphire substrates) to provide horizontal chips or devices having at least two electrical contacts on a same side of the LED chip. This type of structure can advantageously obviate the need for wire bonds or wired connectors. For example, horizontally structured LED chips can comprise a bond-pad-down design, which eliminates the need for wire bonds or wired connectors. An example of a horizontal LED chip structure is discussed by way of example in U.S. patent application Ser. No. 14/019,257, the disclosure of which is incorporated by reference herein in the entirety.

LED chips and/or portions of LED chips provided in arrays as described herein may be at least partially coated with one or more wavelength conversion materials, such as phosphors and/or lumiphors. Such materials can absorb a portion of light from the LED chip and emit a different wavelength of light such that the light emitter package emits a combination of light from each of the LED chip and the phosphor. In some aspects, LED arrays emit what is perceived as white light resulting from a combination of light emission from the LED chip and the wavelength conversion material.

In some aspects, a white emitting array can consist of LED chips that emit light in the blue wavelength spectrum and wavelength conversion material (e.g., phosphor) that absorbs some of the blue light and re-emits light in the yellow, green, and/or red wavelength spectrum. The array can therefore emit a white light combination of blue and yellow, green, and/or red light. In other aspects, the LED chips emit a non-white light combination of blue and yellow and/or green light as described in U.S. Pat. No. 7,213,940. LED chips emitting red light or LED chips covered by a phosphor that absorbs LED light and emits a red light are also contemplated herein. LED arrays as described herein can comprise any suitable color temperature such as warm white or cool white color temperatures.

Referring now to FIGS. 1A-5, FIGS. 1A-1E illustrate various views of components having a respective LED chip and/or various arrays of LED chips according to the present subject matter. FIGS. 1A through 1E illustrated respective light emitter components 10A to 10E. Each component 10A to 10E can comprise a substrate or a submount 12 over which at least one light emitter is provided. Although FIG. 1A illustrates a single chip for illustration purposes only, components described herein may comprise multiple chips in an array as illustrated in FIGS. 1B-1E.

Components 10A through 10E illustrated in respective FIGS. 1A-1E may each include a submount 12, at least one LED chip 14 disposed over the submount 12, and a reflective surface 16 disposed on or over the submount 12. For example, reflective surface 16 may be disposed between LED chip(s) 14 and submount 12, or portions thereof. Components 10A through 10E illustrated in respective FIGS. 1A-1E can further comprise an optional outer region or portion 18, which at least partially surrounds the one or more LED chips 14 and reflective surface 16. In some aspects, outer portion 18 is disposed fully about each side of LED chips 14 in an LED populated area and reflective surface 16. Components described herein may be devoid of outer portion 18 (see e.g., FIG. 4A), as reflective surface 16 may extend all the way to outermost edges of submount 12.

Referring to FIGS. 1A-1E in general and in some aspects, submount 12 is at least partially light reflective of light emitted by chip(s) 14. Light emitted by chip(s) 14 may further be reflected from components 10A through 10E via reflective surface 16, also referred to as a light emitter surface (LES), which is disposed between portions of submount 12 and LED chip(s) 14. Reflective surface 16 may include one or more layers of material, at least one of which reflects light. The one or more chips 14 and reflective layer 16 can comprise a central region that can be at least partially surrounded by an optional outer portion 18 of submount. In some aspects, outer portion 18 can fully surround the one or more LED chips 14 and reflective surface 16 for forming a border or perimeter around chips 14 and reflective surface 16. Reflective surface 16 can be disposed proximate a chip populated area, in some aspects directly below a chip populated area for reflecting light. The outer boundaries of reflective surface 16 can define a surface area configured to reflect light in any direction.

In some aspects, submount 12 comprises a material having a high thermal resistance and a low thermal conductivity. Suitable materials may include, but are not limited to ceramic based, polymeric materials, plastic, and/or organic materials. Submount 12 can comprise, for example, aluminum nitride (AlN), aluminum oxide (Al$_2$O$_3$), or the like. In other aspects, submount 12 can comprise a printed circuit board (PCB), a metal core printed circuit board (MCPCB), FR-4, a flexible circuit, portions thereof, and/or or any other suitable material. In some embodiments, submount 12 comprises a ceramic panel (e.g., an AlN panel) configured to support a plurality of LED chips 14 provided in an array.

An array of chips can comprise at least two LED chips 14, and in some aspects, more than two LED chips disposed in a systematic arrangement. The arrangement of LED chips 14 may form a substantially square shape, a rectangular shape, a circular shape, or any other shape of arrangement, and the array may include LED chips 14 provided in one or more rows, columns, and/or combinations thereof. Providing an AlN panel or submount 12 is advantageous as it has a high thermal conductivity and low thermal resistance, which more readily dissipates heat and allows LED chips 14 to run cooler at steady state. Any number (quantity), size, and/or color of LED chips 14 may be provided in an array.

Submount 12 can comprise a planar surface (e.g., an upper surface) that faces a lower surface of LED chips 14 for attaching thereto. Submount 12 faces a lower surface of LED chips 14 having electrical contacts (e.g., anode and cathode bond pads) disposed thereon. The planar surface of submount 12 can comprise one or more electrically conductive features, such as one or more electrically conductive traces (e.g., 32A, 32B, FIG. 3). The conductive features can be patterned over submount 12 using any methods and/or materials, such as metal, copper (Cu), silver (Ag), nickel (Ni), titanium (Ti), reflective layers, barrier layers, gold (Au), electroless nickel immersion gold (ENIG) materials, and/or a nickel-palladium-gold metal stack (e.g., ENEPIG or ENIPIG) over a Cu base layer. The conductive features disposed over submount 12 are configured to electrically connect the multiple LED chips 14 in series, parallel, or combinations of series and parallel connections. The one or more LED chips 14 can be mounted to submount 12 and/or the traces thereof via metal, metallic solder, flux, silicone, epoxy, and/or dispensed polymeric materials that may be thermally and electrically conductive.

Notably and in some aspects, the one or more conductive features (e.g., 32A, 32B, FIG. 3), can comprise an Au plating without experiencing a significant loss in light or lumens compared to Ag traces. With the relatively chips 14 and the relatively high packing disclosed by the instant chip/trace designs and layouts, there may be a minimal exposed Ag, and thus no lumen loss. This is advantageous, as Au is resistant to sulfur. In contrast, Ag traces may need a barrier coating or layer for resisting sulfur.

The size of submount 12 can vary depending on the lighting application and/or the size of LED chip(s) 14 and/or the size of an array of chips 14 in a chip populated area. The shape of submount 12 can also vary depending on the lighting application and/or the shape of LED chip(s) 14 or array of LED chips 14. A square, rectangular, circular, non-square, symmetrically, and/or asymmetrically shaped submount 12 can be provided.

Still referring to FIGS. 1A-1E in general, the one or more chips 14 can comprise chip on board (COB) chips that are attached to electrical contacts disposed on submount 12. Each chip can comprise multiple semiconductor layers arranged in any suitable structure. In some aspects, LED chips 14 comprise a horizontally structured chip having multiple electrical contacts or bond pads (e.g., 28A, 28B, FIG. 2B) disposed on a same side and/or surface of chip 14. Horizontally structured chips are configured to physically and/or electrically attach to electrically conductive portions (e.g., electrically conductive traces or conductive pads) of component 10A and/or submount 12 for receiving electrical current. Electrical current can energize one or more materials or layers of chips 14, causing chips 14 to emit light.

In some aspects, LED chip 14 comprises a plurality of semiconductor layers that may be fabricated or otherwise provided on a sapphire substrate, which may be a carrier substrate or a growth substrate. Multiple electrically conductive bond pads (e.g., 26A, 26B, FIG. 2B) may be provided on a bottom (lower) surface of chip 14 for receiving and passing electrical current through chip 14. The electrically conductive bond pads disposed on each chip 14 can comprise electrical contacts, for example, anode and cathode contacts that may mount or attach to underlying surfaces of submount 12 via solder, epoxy, flux, a flux eutectic die attach material, silicone, or combinations thereof. The electrical contacts can comprise at least two bond pads of an opposing electrical polarity (e.g., an anode and a cathode) for attaching to an underlying electrically conductive trace or pad of submount 12 via a die attach process. Any materials and/or processes capable of attaching LED chip 14 to an electrical component (e.g., a trace) of submount 12 are contemplated herein.

Still referring generally to FIGS. 1A-1E and in some aspects, reflective surface 16 can comprise one or more layers of material configured to reflect light from chip 14. Reflective surface 16 can comprise a reflective polymer, a metal, ceramic, a reflective solder mask material, a material having reflective particles disposed therein, and/or combinations thereof. In some aspects, reflective surface 16 covers most portions of submount 12. For example, reflective surface 16 may cover some portions of the metallic traces for minimizing the amount of light absorbed by the metallic traces, while leaving other portions of the metallic traces exposed for connecting to LED chips 14. In other aspects, reflective surface 16 only covers portions of submount that are below and/or adjacent to a chip populated area, for example, in gaps disposed between traces.

In some embodiments, reflective surface 16 comprises a white solder mask that extends up to the edges of each LED chip 14, up to the outermost edges of submount 12 thus covering portions of submount 12 not covered by chips, and directly below a dam or retention material (e.g., 42, see FIG. 4D) for increasing reflectivity and light extraction per component.

Notably, the ratio between the overall area occupied by LED chips 14, and the epitaxial (epi) layers thereof, with respect to the overall area of reflective surface 16 can be maximized over submount 12 for improving light extraction from respective components 10A to 10E without experiencing crowding effects. "Crowding effects" refer to light that may be lost via the blockage, absorption, or general interference of light by neighboring chips that may be spaced too closely together. Typically, decreasing the spacing between chips may increase crowding effects. However, the spacing between chips 14 in arrays as set forth herein may be decreased without perceptible losses due to crowding effects, in some aspects by utilizing low-refractive index (RI) horizontally structured sapphire based chips 14 disposed over an AlN submount 12 having a reflective surface 16. Maximizing the ratio between the LED chips (e.g., or active "epi" layers of the LED chips) and the reflective surface 16 to more than 0.40 may be accomplished by providing larger chips 14, providing more chips 14, and minimizing the spacing between the chips 14 for increasing the amount of light generated and reflected from the array of LED chips 14. In some aspects, the ratio between the combined LED chip area and the reflective surface 16 is at least 0.6, and in some embodiments, greater than 0.6.

As noted above, components 10A to 10E may comprise an optional outer portion 18 disposed at least partially around outermost edges of one or more chips 14 and/or reflective surface 16. Outer portion 18 of submount 12 may be uncovered (bare) or optionally covered with one or more layers of material. Where covered, outer portion 18 may be disposed below a reflective layer of material, an opaque layer of material, a transparent layer of material, a dam, an optical element, a metal layer, or the like.

FIGS. 1A-1E illustrate various dimensions associated with respective components 10A through 10E. LED chips 14, submount 12, and reflective surfaces 16 may vary in size and/or shape. For example, submount 12 may include a length 12X and a width 12Y sized and/or shaped for supporting one LED chip 14, two LED chips 14, or more than two LED chips 14. Submount length 12X and submount width 12Y may be substantially equal (e.g., a square, circle, or regular shape) or unequal (e.g., a rectangle). Any size and/or shape of submount 12 can be provided. Exemplary submount 12 dimensions that support one or more chips 14 and/or an array of LED chips 14 may include a submount 12 that can be approximately 6 millimeters (mm)×6 mm, approximately 9 mm×9 mm, approximately 12 mm×12 mm, approximately 17 mm×17 mm, approximately 19 mm×19 mm, 5.6 mm×3.85 mm, 8.3 mm×5.6 mm, 11 mm×8.3 mm, 14.6 mm×13 mm, or any other suitable length-by-width dimensions may be provided.

LED chips 14 may also comprise a length 14X and a width 14Y. As the LED chips 14 can comprise straight cut (i.e., not beveled) sides, the product of the length 14X and width 14Y of each LED chip 14 corresponds to the surface area of the "epi" region (i.e., active area) of the LED chip 14 that emits light. The chip 14 area may be increased over submount 12, such that at least 40% or more of the overall area of the reflective surface 16 is occupied by the combined epi regions of respective LED chips 14 for improving the light extraction and efficiency of respective components 10A to 10E.

Chip length 14X and width 14Y may be substantially equal (e.g., a square, circle, or regular shape) or unequal (e.g., a rectangle). Any size and/or shape of chip 14 can be provided. Where multiple chips 14 are provided, each chip 14 may comprise a same size (dimension) or differently sized chips 14 may be used together to form an array over submount 12.

Reflective surface 16 may also comprise a length 16X and a width 16Y. Reflective surface 16 may include a length 16X that is approximately the same or slightly greater than the total (sum) of each chip length 14X. Reflective surface 16 may include a width 16Y that is approximately the same as or slightly greater than the total (sum) of each chip width 14Y. Notably, at least 40% or more of the overall reflective surface 16 (i.e., a total reflective surface area) can be occupied by a single LED chip 14 and/or an array of LED chips 14. Covering at least 40% or more of the reflective area 16 with the combined epi area associated with chips 14 maximizes a ratio between the overall epi area (i.e., the area that emits light) of the LED chips 14 and the reflective surface 16 of submount 12. Maximizing this ratio can provide a high density array of tightly packed LED chips 14 over reflective surface 16 while minimizing or reducing light absorption and/or crowding effects. Sapphire based LED chips have a lower RI than SiC based LED chips, thus, sapphire based LED chips may be spaced more closely together over reflective surface 16 for occupying a greater area of reflective surface 16. This maximizes efficiency and light output of the respective component 10A through 10E. Eliminating wire bonds by providing horizontally structured LEDs 14 further increases the ratio between the total epi area of the LED chips 14 and reflective surface 16, which further improves efficiency and light output.

Outer portion 18 of submount 12 may include a width 18Y disposed at least partially around reflective surface 16 and/or LED chips 14. In some aspects, the width 18Y is approximately equal about all sides of LED chips 14 and reflective surface 16. In some aspects, outer portion 18 may include different widths 18Y about different sides of a given component 10A through 10E, thereby forming an irregular border about chips 14 and reflective surface 16. Width 18Y can for example be a distance of approximately 10 µm, approximately 50 µm, approximately 100 µm, approximately 200 µm, or more than approximately 200 µm. Any width 18Y may be provided outside of reflective surface 16. In some aspects, components are devoid of outer portion 18 (see e.g., FIG. 4A).

Table 1 below provides some exemplary sizes and/or shapes associated with various dimensions illustrated in FIGS. 1A through 1E, and other examples. All length and width dimensions in the table below are in millimeters (mm) unless otherwise specified.

TABLE 1

EXEMPLARY DIMENSIONS (APPROXIMATE)

| Component | Reflective Surface Size (mm) or Area (mm²) L(16X) × W(16Y) or area (mm²) | Chip Size (also Epi Size, in mm) L(14X) × W(14Y) | Chip Quantity | Percentage (Ratio) of Total Chip Epi Area to Reflective Surface Area |
|---|---|---|---|---|
| 10A | 12.05 × 12.05 | 11.88 × 11.88 | 1 | 97% (.97) |
| 10B | 12.4 × 12.4 | 2.8 × 2.8 | 18 | 92% (.92) |
| 10C | 12.8 × 12.8 | 1.4 × 1.4 | 72 | 86% (.86) |
| 10D | 7.6 × 7.6 | 1.15 × 1.15 | 36 | 82% (.82) |
| 10E | 8.4 × 8.4 | 1.15 × 1.15 | 36 | 68% (.68) |
| Example 1 | 28.3 mm² | 1.15 × 1.15 | 12 | 56% (.56) |
| Example 2 | 63.6 mm² | 1.15 × 1.15 | 24 | 50% (.50) |
| Example 3 | 113.1 mm² | 1.15 × 1.15 | 48 | 56% (.56) |
| Example 4 | 283.5 mm² | 1.4 × 1.4 | 72 | 50% (.50) |
| Example 5 | 23.8 mm² | 1.15 × 1.15 | 12 | 67% (.67) |
| Example 6 | 46.48 mm² | 1.15 × 1.15 | 24 | 68% (.68) |
| Example 7 | 91.3 mm² | 1.15 × 1.15 | 48 | 70% (.70) |
| Example 8 | 189.8 mm² | 1.4 × 1.4 | 72 | 74% (.74) |

As Table 1 illustrates above, the ratio between the combined epi area for all LED chips 14 (e.g., calculated from the chip length and width) with respect to the reflective surface 16 is at least 0.4, and in some aspects, at least approximately 0.5 or more. The ratio between the combined epi area for LED chips 14 and reflective surface 16 can, for example, be any number between approximately 0.4 and 1.0, such as approximately 0.5, 0.6, 0.65, 0.7, 0.75, 0.8, 0.85, 0.9, or more than 0.9.

Stated differently, at least 40% of the area of reflective surface 16 is occupied by the combined epi areas of each LED chip 14, and in some aspects, more than 40% of the area of reflective surface 16 is occupied by the combined epi areas of each LED chip 14. In some aspects, at least 50% of the reflective surface 16 area is occupied by epi, at least 60% of the reflective surface 16 area is occupied by epi, at least 70% of the reflective surface 16 area is occupied by epi, at least 80% of the reflective surface 16 area is occupied by epi, at least 90% of the reflective surface 16 area is occupied by epi, at least 95% of the reflective surface 16 area is occupied by epi, or more than 95% of the reflective surface 16 area is occupied by epi. For example, in component 10A in FIG. 1A, approximately 97% of the area of reflective surface 16 is occupied by the combined area of epi regions associated with each LED chip 14.

Figure 1B:
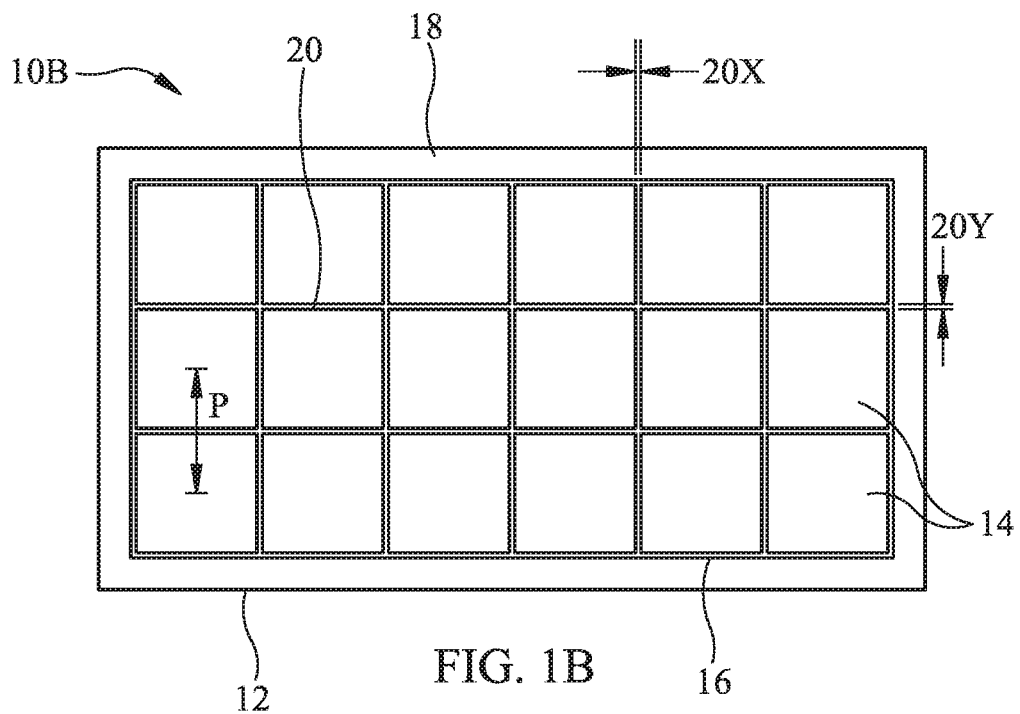

FIG. 1B is a light emitter component 10B that comprises an array of tightly packed LED chips 14. In some aspects, 18 LED chips 14 are provided over submount 12. Notably, LED chips 14 are tightly packed together forming a high density array over submount 12. This increases the color uniformity color emitted by component 10B, as the colors from tightly packed chips can more readily mix. The tightly packed chips 14 also provide a tighter point source of light to be emitted by component 10B. The tightly packed chips 14 can also unexpectedly provide a higher efficiency and brighter device by using fewer chips fabricated over a low-RI substrate (e.g., sapphire), in some aspects by virtue of provision of reflective surface 16 over a high conductively submount 12 (e.g., AlN). In FIG. 1B, approximately 92% of the area of reflective surface 16 is occupied by the combined epi area of each LED chip 14.

Notably, one or more spaces or gaps 20 are disposed between adjacent LED chips 14. The gaps 20 corresponding to distances 20X and 20Y between adjacent LED chips. The sum of distances 20X and 20Y and the respective chip length 14X or width 14Y is a pitch P, which is the distance between center points of adjacent chips 14. The distance 20X may be a first distance between adjacent chips along a first axis that is orthogonal to a second axis of a second distance 20Y. Distances 20X and 20Y between adjacent LED chips 14 can be minimized to unexpectedly small (minimal) distances without device 10B exhibiting perceptible losses in light or efficiency due to crowding. Distances 20X and 20Y may be the same or different.

In some aspects, distances 20X and 20Y between chips is approximately 200 μm or less, approximately 100 μm or less, or less than approximately 50 μm. Minimizing distances 20X and 20Y between LED chips 14 and providing reflective surface 16 therebetween maximizes brightness, light extraction, and provides more efficient components as brighter light can be obtained from fewer chips 14.

FIG. 1C is a light emitter component 10C that comprises a rectangular (non-square) array of tightly packed LED chips 14. In some aspects, 72 LED chips 14 are provided over submount 12. In FIG. 1C, approximately 86% of the area of reflective surface 16 is occupied by the combined epi area of LED chips 14.

FIG. 1D is a light emitter component 10D and FIG. 1E is a light emitter component 10E. Each component 10D and 10E comprise an array of tightly packed LED chips 14. In some aspects, each component 10D and 10E comprises 36 LED chips over submount 12. Device 10D has a tighter spacing as approximately 86% of the area of reflective surface 16 is covered by epi, by virtue of smaller distances 20X and 20Y between adjacent chips 14. Pitch P is also minimized in component 10D. Devices 10D and 10E are efficient devices by virtue of the highly dense array of sapphire based LED chips 14 disposed over a reflective surface 16 and AlN submount 12. Each component may be designed for use in different lighting applications.

It will be appreciated by persons having skill in the art that the LED components, arrays, and dimensions illustrated by FIGS. 1A through 1E are exemplary and for illustration purposes only. Components and/or arrays as described herein may vary and/or differ in terms of dimensions, spacing, materials, and/or structures encompassing other dimensions, spacing, materials, and/or structures than the embodiments specifically shown.

Figure 2A:
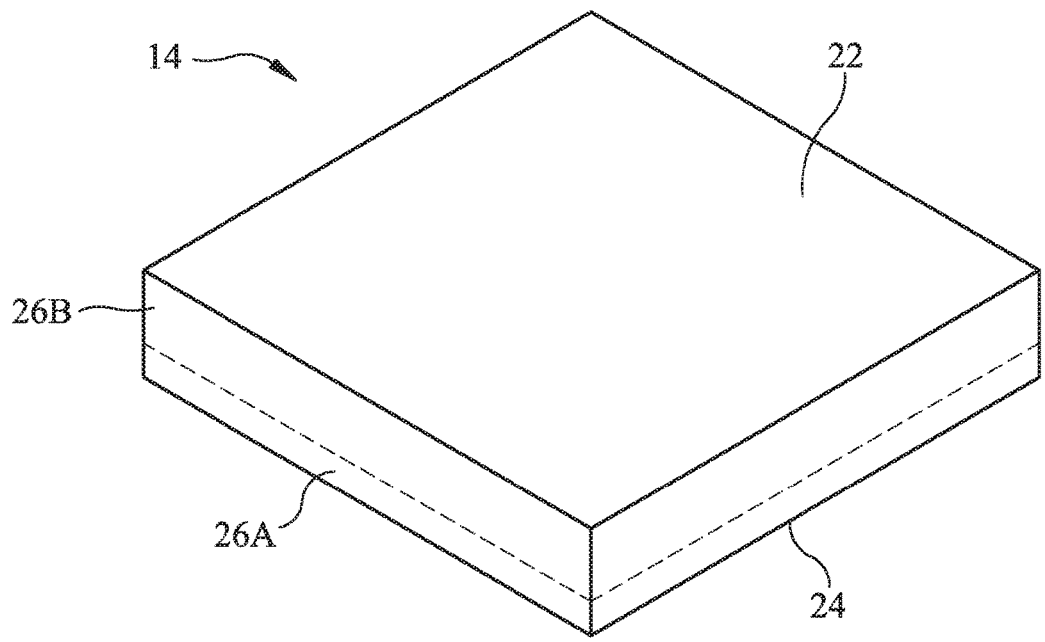
FIGS. 2A-2B are respective perspective and bottom plan views of an LED chip according to the present subject matter.
Figure 2B:
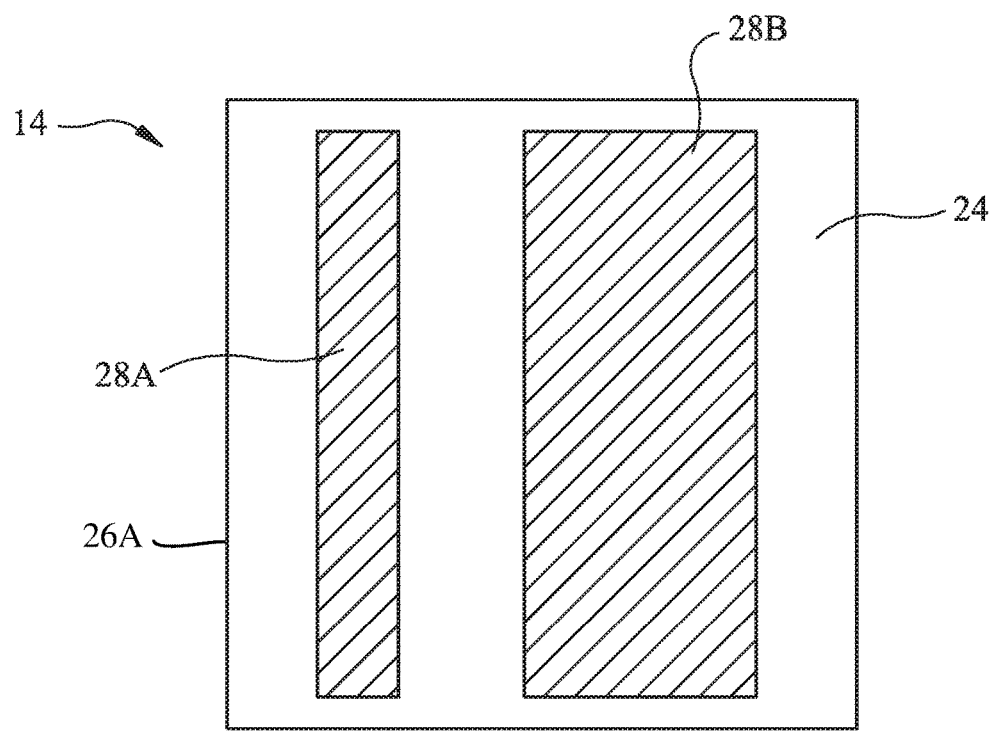

FIGS. 2A and 2B are respective top perspective and bottom plan views of LED chips 14 according to the present subject matter. LED chip 14 can comprise a first surface 22 and an opposing second surface 24. An epi region 26A is fabricated on or over a sapphire substrate 26B. Epi region 26A is configured to emit light when energized by electrical current. Notably, epi region 26A terminates at second surface 24, which may include a lower surface of LED chip 14 that faces submount 12 (FIGS. 1A to 1E) for attaching or mounting thereto. LED chip 14 can comprise substantially straight cut (vertical and/or parallel) exterior sides, such that epi region 26A can comprise a planar surface area calculated by multiplying the LED chip length (e.g., 12X, FIG. 1A) by the LED chip width (e.g., 12Y, FIG. 1A). The combined planar surface area associated with the epi region 26A of each LED chip 14 disposed on a submount 12 (FIG. 1A) is maximized with respect to the planar surface area of a reflective surface (e.g., 16, FIG. 1A) for maximizing light extraction and efficiency.

As FIG. 2B illustrates, a first electrical contact 28A and a second electrical contact 28B can be disposed or fabricated on epi region 26A. When an electrical bias is applied across respective first and second electrical contacts 28A and 28B, electrical current passes through and illuminates epi region 26A of LED chip 14. First and second electrical contacts 28A and 28B are disposed on a same side or surface of LED chip 14, and each contact can be fabricated over an oppositely doped semiconductor layer. The holes and electrons in the oppositely doped layers can recombine in response to activation by electrical current, and emit light from multiple sides of LED chip 14.

When activated by electrical current, most of the light emitted by LED chip 14 will be emitted upward through sapphire substrate 28B and/or from lateral sides. Light hitting the sapphire substrate 28B of a neighboring chip can be diffracted or reflected by the sapphire, as opposed to other materials such as SiC, which absorbs more light than sapphire. Moreover, sapphire includes a lower refractive index, meaning that the sapphire chips can be made larger with a lower light extraction efficiency loss compared SiC.

In some embodiments, light emitted towards substrate 12 (FIG. 1A) can be reflected by reflective surface 16 (FIG. 1B). Thus, LED components incorporating horizontally structured sapphire chips with bottom contacts (e.g., devoid of wire bonds) are more efficient and brighter than existing devices. In addition to this, adjacent sapphire based LED chips 14 can be placed closer than 0.3 mm (e.g., 0.2 mm, 0.1 mm, or less than 0.1 mm) and exhibit little to no crowding effects. Horizontally structured LED chips 14 can also be manufactured larger than other horizontally structured chips, by virtue of straight cut sides, which do not constrain epi area and/or light emitter surfaces. Thus, horizontally structured sapphire based LED chips 14 with lower contacts 28A and 28B exhibit better light extraction than other chips of a similar size and better thermal management than chips utilizing wire bonds. Because of the increased efficiency, fewer chips 14 may be used per component, which translates to higher production yields and lower costs.

An array of LED chips 14 can be formed by selecting chips from various light color or wavelength bins for providing a combined light output of any desired color, such as warm white or cool white light. Each LED chip 14 in an array of LED chips 14 may comprise a same color or different colors. Color mixing may be achieved, for example, by using blue, green, cyan, amber, red and/or red-orange LED chips 14 together in any combination. An optional phosphor (FIGS. 4E, 4F) can be locally applied over each LED chip 14 or as a continuous layer over multiple chips 14. An example of selecting chips from various color bins to produce desired color characteristics is described in commonly assigned U.S. Patent Application 2010/0140633, filed Apr. 17, 2009, which is entirely incorporated by reference herein. A detailed example of using groups of LED chips emitting light of different wavelengths to produce substantially white light can also be found in commonly assigned U.S. Pat. No. 7,213,940, which issued on May 8, 2007 and which is entirely incorporated by reference herein.

Referring to FIGS. 2A and 2B in general, LED chips 14 can comprise square chips that are approximately 1000 microns (μ or μm) in size, meaning that chips are approximately 1000 μm wide per side. LED chips 14 can also comprise square chips that are more or less than or approximately equal to 1000 μm (1 mm) per side, such as approximately 500 μm per side, approximately 300 μm per side, or less than approximately 300 μm per side, approximately 1.15 mm per side, approximately 1.4 mm per side, approximately 2 mm in size, or more than 2 mm in size. LED chips 14 may also be substantially rectangular and can comprise any suitable dimension, where desired.

It is contemplated that different colors of LED chips 14 can be provided over submount 12 (FIG. 1E) in one or more arrays. It is also contemplated that various numbers (quantities) of LED chips of various sizes can be combined in different ways to form a component according to embodiments of the subject matter. LED chips 14 of two different sizes, three different sizes, and/or four or more different sizes can be used together in a single array. Two LED chips may be provide in an array, three LED chips may be provided in an array, 10 or more LED chips may be provided in an array, 18 or more LED chips may be provided in an array, 36 or more LED chips may be provided in an array, 72 or more LED chips may be provided in an array, or hundreds of LED chips may be provided in an array. The array may include serially connected LED chips 14, parallel-connected LED chips 14, or combinations thereof. In some aspects, multiple strings of serially connected LED chips 14 may be provided, where each string is electrically connected in parallel with other strings.

It will be appreciated by persons having skill in the art that the LED chips illustrated by FIGS. 2A and 2B are exemplary and for illustration purposes only. LED chips 14 may vary and/or differ in terms of dimension(s), material(s), location of structure(s), layer(s), and/or other aspect(s) than the embodiments specifically shown.

Figure 3:
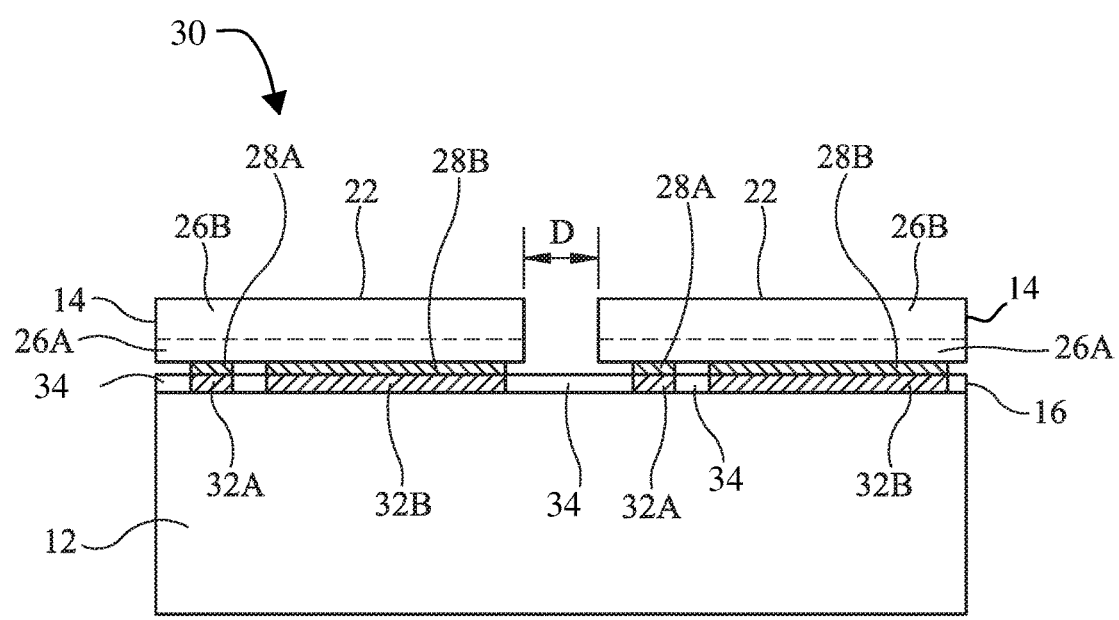
FIG. 3 is a sectional view of a light emitter component according to the present subject matter.

FIG. 3 is a sectional view of a light emitter component, generally designated 30. Component 30 comprises multiple LED chips 14 disposed over submount 12. LED chips 14 may be provided in an array comprising multiple rows and/or columns. LED chips 14 may be electrically connected in series, parallel, and/or combinations thereof. LED chips 14 may be electrically connected in series or parallel via a network of electrically conductive traces, where desired. Notably, LED chips 14 may directly contact electrically conductive traces without the need for wire bonds or wired connections. In some aspects, the electrically conductive traces are disposed directly on and contact submount 12.

Submount 12 can comprise any suitable material, such as a material having a high thermal conductively and a low thermal resistance. In some aspects, submount 12 comprises ceramic, such as AlN. Pairs of first and second electrically conductive traces 32A and 32B, respectively, are disposed over submount 12. The traces can comprise at least one electrically conductive material such as metal or metal alloys. In some aspects, each pair of first and second traces 32A and 32B can comprise more than one layer of material, such as one or more layers of Cu, Ti, Ag, Ni, ENIG, or the like. In some aspects, coating traces with Au (e.g., as in ENIG) may be advantageous since the patterns may be so intricate, spaced closely together, and have fine (e.g., thin) gaps therebetween.

Each pair of first and second traces 32A and 32B can be plated (e.g., electroplated, immersion, immersion-less plating), deposited (e.g., physically or chemically), applied, or sputtered using known techniques. First and second traces 32A and 32B can be of any suitable thickness as, for example, each trace may comprise a thickness of between approximately 25 and 50 μm, approximately 50 μm to 75 μm, approximately 75 to 100 μm; or more than 100 μm thick. Each trace may also comprise ENIG materials for improved adhesion to LED chips 14.

Each pair of respective first and second traces 32A and 32B is configured to attach to respective first and second electrical contacts 28A and 28B of respective LED chips 14. An electrical signal can be applied to LED chips 14 via first and second traces 32A and 32B. For example, electrical signal from first trace 32A can be communicated directly to LED chip 14 by virtue of electrical communication between first trace 32A and first electrical contact 28A. Electrical signal can pass through the respective LED chip 14 and back out to traces as second electrical contact 28B can communicate directly with second trace 32B. One or more gaps can provide electrical isolation between each electrical trace and each electrical contact. Any light that is reflected from sides and/or bottom surfaces of the respective LED chips 14 can reflected via reflective surface 16. Notably, first and second electrical traces 32A and 32B are limited in size to approximately the same size as first and second electrical contacts 28A and 28B. This can minimize the amount of metal required per component 30, and can maximize an amount of reflective surface 16 and/or reflective material 34 provided per device.

Adjacent LED chips 14 can be spaced apart by a distance D. Distance D can correspond to the distance between outermost and opposing edges of adjacent LED chips 14. Distance D can comprise approximately 0.3 mm or less, approximately 0.2 mm or less, approximately 0.1 mm or less, or less than approximately 0.1 mm.

At least one gap can be provided between respective first and second traces 32A and 32B, and between each pair of traces. Notably, a reflective material 34 can be disposed between portions of each trace, for example, in the gaps between each trace (e.g., 32A and 32B). The reflective material 34 comprises a light emitter reflective surface 16 between portions of LED chips 14 and submount 12. In some aspects, reflective material 34 abuts respective first and second electrical traces 32A and 32B. In other aspects, reflective material 34 covers portions of respective first and second electrical traces 32A and 32B. The gaps between traces can extend to an upper surface of submount 12 for electrically separating portions respective first and second electrical traces 32A and 32B.

Reflective material 34 can comprise any material configured to reflect light either specularly or diffusively, and in some aspects, may comprise a mirror-type reflector. Reflective material 34 can comprise a reflective resin, a reflective polymer, a reflective ceramic, a reflective plastic, a material comprising reflective particles, any combination thereof, or the like. In some embodiments, reflective material 34 comprises a solder mask material. Reflective material 34 can comprise a same thickness as traces (32A, 32B), or a different thickness. In some aspects, reflective material 34 comprises a substantially opaque layer of material having a thickness of between approximately 25 and 50 µm, approximately 50 µm to 75 µm, approximately 75 to 100 µm, or more than 100 µm thick. Reflective material 34 can comprise a solder mask that is silver or white. Traces (32A and 32B) can be exposed between portions of reflective material 34 for bonding or attaching to LED chips 14.

Notably, LED chips 14 can dissipate heat to submount 12 via traces (32A, 32B). LED chips 14 can attach to traces via an attachment material (not shown) such as solder, epoxy, flux, or the like. The epi region 26A of each LED chip 14 is configured to face traces (32A, 32B) and reflective surface 16. Notably, portions of epi region 26A and sapphire substrate 26B extend over portions of reflective surface 16, so that any light emitted by epi region 26A is reflected via reflective surface 16 comprising reflective material 34. Providing tightly spaced, low-RI sapphire based LED chips 14 having an epi region/reflective surface ratio of at least 0.4 over reflective surface 16 greatly improves light extraction per component 30 and brightness. Notably, any light that is emitted below an LED chip 14 may be reflected via reflective surface 16, as portions of reflective surface 16 and reflective material 34 extend below portions of each LED chip 14. Similarly, any light that may be emitted sideways from each LED chip 14 can pass through the sapphire substrate 26B of the neighboring LED chip 14 thereby minimizing or eliminating crowding effects. For at least these reasons, LED chips 14 and epi regions 26A thereof can be located closer together than previously thought possible.

Providing reflective material 34 over portions of submount 12 is advantageous, as a thinner submount 12 can be utilized. Conventional wisdom advocates the use of a thicker submount 12 for achieving maximum reflectivity, however, reflective material 34 obviates the need for a thicker submount. Component 30 can comprise a submount 12 having a thickness that is less than approximately 1 mm, for example, of between approximately 0.1 mm and 0.25 mm, between approximately 0.25 mm and 0.5 mm, or between approximately 0.5 mm to 0.95 mm.

In some embodiments, each LED chip 14 may include an active layer disposed between two oppositely doped layers that emit light in response to an electrical signal applied to the oppositely doped layers. A first reflective layer may be disposed adjacent to at least one of the oppositely doped layers. The first reflective layer may have an index of refraction that is different from the active LED structure, so that the first reflective layer reflects at least some active layer light. Each chip 14 may also include a second reflective layer on the first reflective layer. The second reflective layer can be configured to reflect light that is not reflected by the first reflective layer. The first reflective layer may include a dielectric material. An example of an LED chip having this structure is discussed by way of example in U.S. patent application Ser. No. 13/909,927, the disclosure of which is incorporated by reference herein in the entirety. The two reflective layers and/or use of a multi-layer reflector including a dielectric material within an LED chip 14 improves the amount of light extracted per chip, thereby contributing to an increased overall brightness of the respective component.

FIGS. 4A-4F are sectional views of schematic respective light emitter components 40A through 40F according to the present subject matter. Each component 40A through 40F includes a submount 12, a light emitter surface LES disposed over the submount 12, and an array of LED chips 14 disposed over the light emitter surface LES of submount 12. LED chips 14 are provided in an array that forms an LED populated area. LED chips 14 are in an LED populated area, the outer boundary of which corresponds to the outermost edges of the outermost LED chips in the array. LED chips 14 comprise sapphire based chips having a horizontal structure and an epi region (e.g., 26A) that faces light emitter surface LES. The array of LED chips 14 comprises an emitter axis that is orthogonal to the elongated axis and planar surface of light emitter surface LES, the plane defining the LED chip populated area, which passes through the geometric center of the minimum-area rectangle bounding the LED chip populated area.

Notably, light emitter surface LES comprises a reflective surface that is reflective to light emitted by LED chips 14 in the LED chip populated area. The outer boundaries of light emitter surface LES define a surface area that may reflect light in any direction from below (e.g., underlying) LED chips 14. In some embodiments, light emitter surface LES extends beyond the footprint of the LED chip populated area, and outermost edges of outermost LED chips 14. Light emitter surface LES may be substantially the same size as the LED populated area, or slightly larger, for example extending approximately 10 µm longer than the LED chip populated area, approximately 25 µm longer than the LED chip populated area, or more than approximately 50 µm longer than the LED chip populated area.

Notably, the combined epi area for all LED chips 14 (e.g., calculated by the chip length and width) is at least approximately 40% of the area of light emitter surface LES. That is, at least approximately 40% of the planar surface area of light emitter surface LES is occupied by the combined planar surface areas of the combined epi regions of LED chips 14. In some aspects, at least 50% of the planar surface area of light emitter surface LES is occupied by the combined epi regions of the LED chips, at least 60% of the planar surface area of light emitter surface LES is occupied by the combined epi regions of the LED chips, at least 70% of the planar surface area of light emitter surface LES is occupied by the combined epi regions of the LED chips, at least 80% of the planar surface area of light emitter surface LES is occupied by the combined epi regions of the LED chips, at least 90% of the planar surface area of light emitter surface LES is occupied by the combined epi regions of the LED chips, or more than 90% of the planar surface area of light emitter surface LES is occupied by the combined epi regions of the LED chips. Providing a greater surface area of epi over light emitter surface LES as in components 40A to 40F results in a greater amount of light being generated and reflected, thus resulting in brighter, more efficient LED lighting components.

Figure 4A:
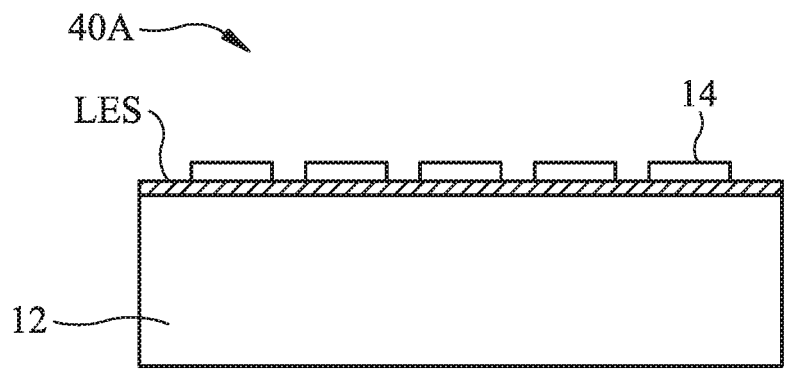
FIGS. 4A-4F are sectional views of light emitter components according to the present subject matter.

FIG. 4A is a schematic illustration of a light emitter component 40A. Notably, component 40A comprises a light emitter surface LES that extends substantially flush with outermost edges of submount 12. That is, component 40A comprises an LED populated area having a plurality of LED chips 14. Light emitter surface LES is disposed below portions of LED chips 14 for reflecting light therefrom. Light emitter surface LES can comprise a reflective plastic, reflective coating, reflective particles, solder mask material or the like. Light emitter surface LES can be disposed between portions of electrically conductive traces (not shown) for increasing reflectivity and light extraction of component 40A. In some aspects, light emitter surface LES is disposed in gaps between traces, and between opposing surfaces of traces. Submount 12 can comprise ceramic, such as AlN. Unlike the embodiments in FIGS. 1A through 1E, component 40A can be devoid of an outer region (e.g., 18, FIG. 1A) and utilize a submount 12 that is substantially fully coated with a reflective material for forming light emitter surface LES. In some embodiments, at least 75% of submount 12 is covered with light emitter surface LES, at least 80% of submount 12 is covered with light emitter surface LES, at least 90% of submount 12 is covered with light emitter surface LES, at least 95% of submount 12 is covered with light emitter surface LES, or more than 95% of submount 12 is covered with light emitter surface LES.

Figure 4B:
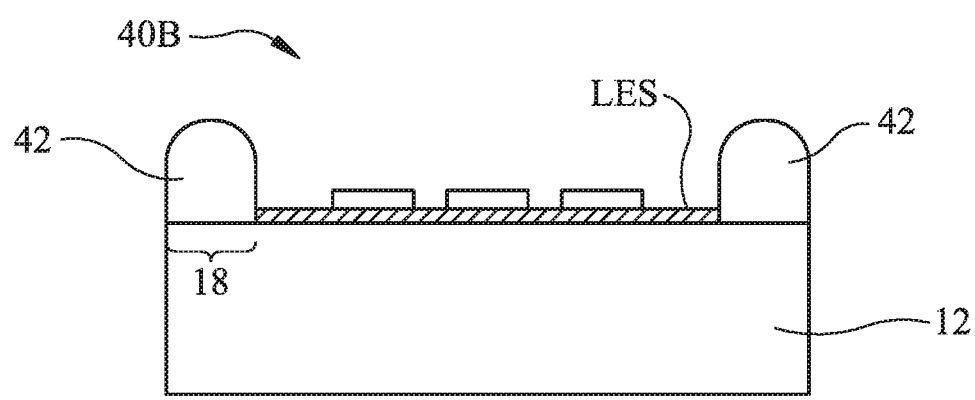

FIG. 4B is a light emitter component 40B having a light emitter surface LES disposed below and/or between portions of one or more reflective dams, walls, or retaining members 42. Retaining members 42 can comprise any size (e.g., thickness, diameter, length, or width), material, and/or shape, and in some aspects is a retaining structure or wall that is dispensed around the array of LED chips 14. Light emitter surface LES may extend flush against edges of retaining members 24. In some aspects, retaining members include walls of a reflective dam.

Figure 4C:
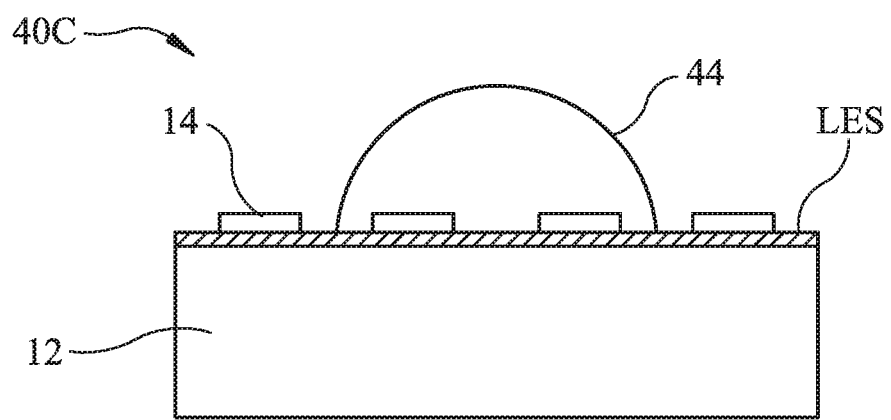

FIG. 4C is a light emitter component 40C comprising a submount 12, light emitter surface LES, LED chips 14, and an optical element 44. "Optical element" as used herein is intended to be used in the broadest sense. Such an element may affect light by bending and/or concentrating light rays, by color mixing, diffraction, or by any combination of these effects. A wavelength conversion material, such as phosphor, can also be optionally provided over portions of optical element 44 and/or LED chips 14 for converting light into a desired color.

Optical element 44 can comprise plastic, resin, glass, or the like. In some aspects, optical element 44 may be molded in place or otherwise formed or attached to component 40C as desired. In some aspects, optical element 44 can comprise silicone that is molded over LED chips 14. Optical element 44 may contact LED chips 14, light emitter surface LES, and/or submount 12. Light emitter surface LES may extend beyond outermost edges of lens 44 and flush with outermost edges of submount 12. In some aspects, a clearance is maintained between the edge of LED chips 14 and the edge of the optical element 44. Any size, shape, and/or sectional shape of optical element 44 can be provided. Optical element 44 may also easily be adapted for use with a secondary lens or optics that can be provided over element 44 by an end user to facilitate beam shaping. Such secondary lenses are generally known in the art, with many of them being commercially available.

Figure 4D:
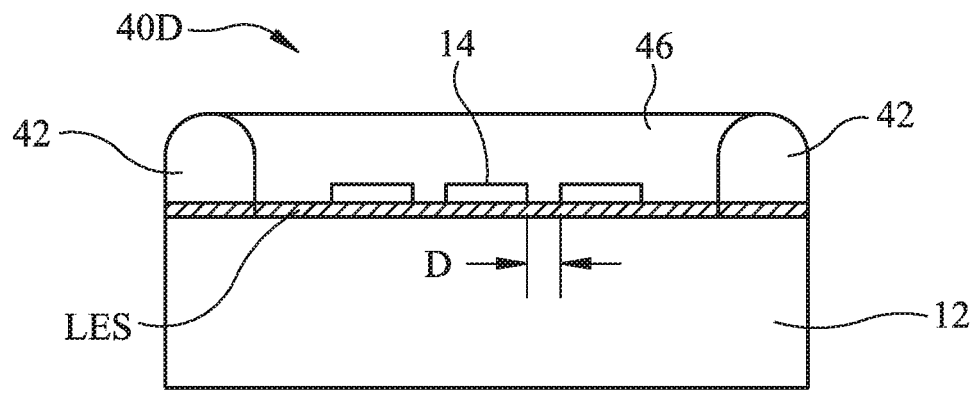

FIG. 4D is a light emitter component 40D that is similar to that shown in FIG. 4B, however, light emitter surface LES extends below portions of retention member 42 and between portions of submount 12 and retention member 42. That is, light emitter surface LES extends over a majority of the planar surface area of submount 12, including surfaces below retention material 42, with the exception of extending over at least some portions of traces. An optional filing material 46 may also be disposed between portions of retention member 42, for example, between portions of a retention wall or structure. In some aspects, filling material 46 comprises silicone, glass, or any other material. Filling material 46 may be transparent, semi-transparent, include a wavelength material and/or be devoid of wavelength conversion material.

Adjacent LED chips 14 in component 40D can be spaced apart by a distance D. Distance D can correspond to the distance between outermost and opposing edges of adjacent LED chips 14. Distance D can comprise approximately 0.3 mm or less, approximately 0.2 mm or less, approximately 0.1 mm or less, or less than approximately 0.1 mm.

Figure 4E:
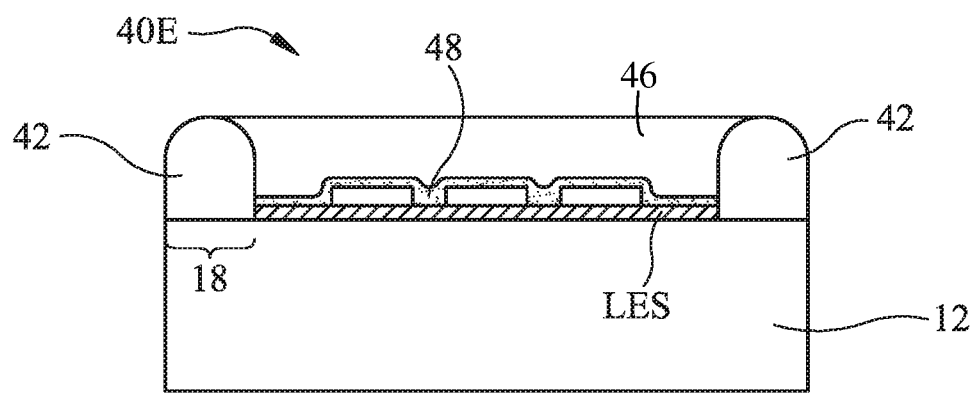

FIG. 4E is an exemplary light emitter component 40E comprising an optional wavelength conversion material 48 disposed over portions of LED chips 14. Wavelength conversion material 48 can comprise one or more phosphors that are coated or layered over LED chips 14, for example, via spraying or causing the phosphor to settle over chips 14.

Figure 4F:
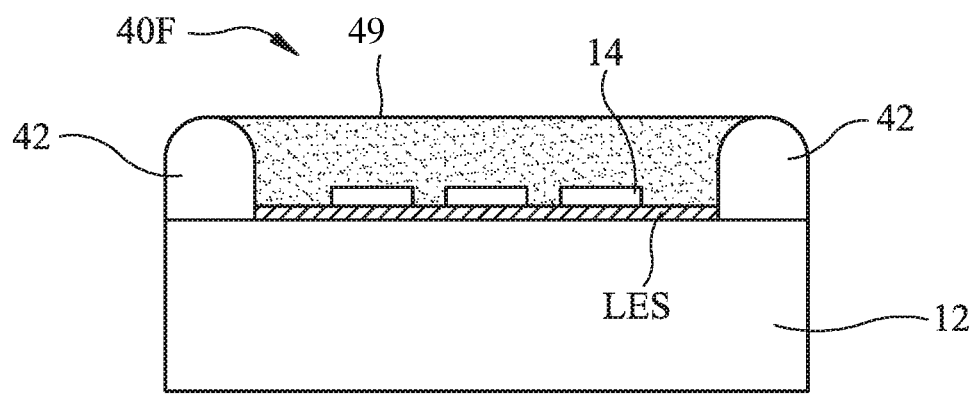

FIG. 4F is an exemplary light emitter component 40F comprising a filing material 49 that has an optional wavelength conversion material dispersed therein as indicated by the speckled appearance. The wavelength conversion material may be either uniformly or non-uniformly dispersed in filling material 49.

Figure 4G:
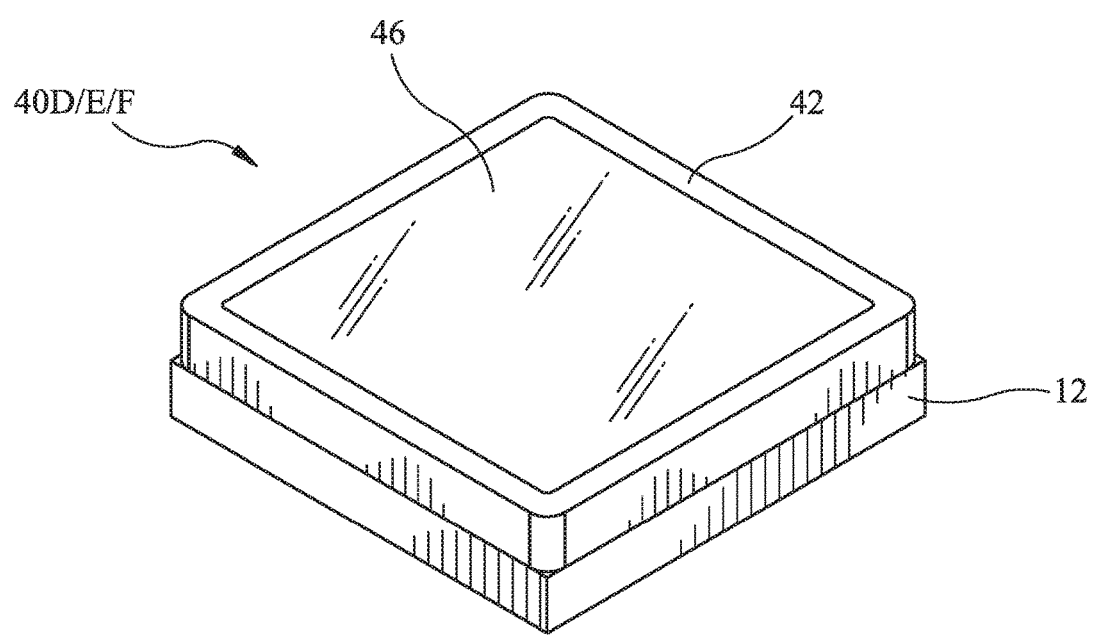
FIG. 4G is a perspective view of a light emitter component according to the present subject matter.

FIG. 4G is a perspective view of an exemplary light emitter component, such as 40D (FIG. 4D), 40E (FIG. 4E) or 40F (FIG. 4F) according to the present subject matter. Light emitter component 40D/E/F comprises a submount 12 over which a retaining member 42 is disposed. Retaining member 42 can comprise a reflective material or structure configured to reflect light emitted by one or more LED chips disposed below filling material 46. Retaining member 42 can retain a filling material 46, such as an encapsulant, resin, silicone, with an optional phosphor material dispersed therein. FIGS. 4A-4G are exemplary and shown for illustration purposes only.

Figure 5:
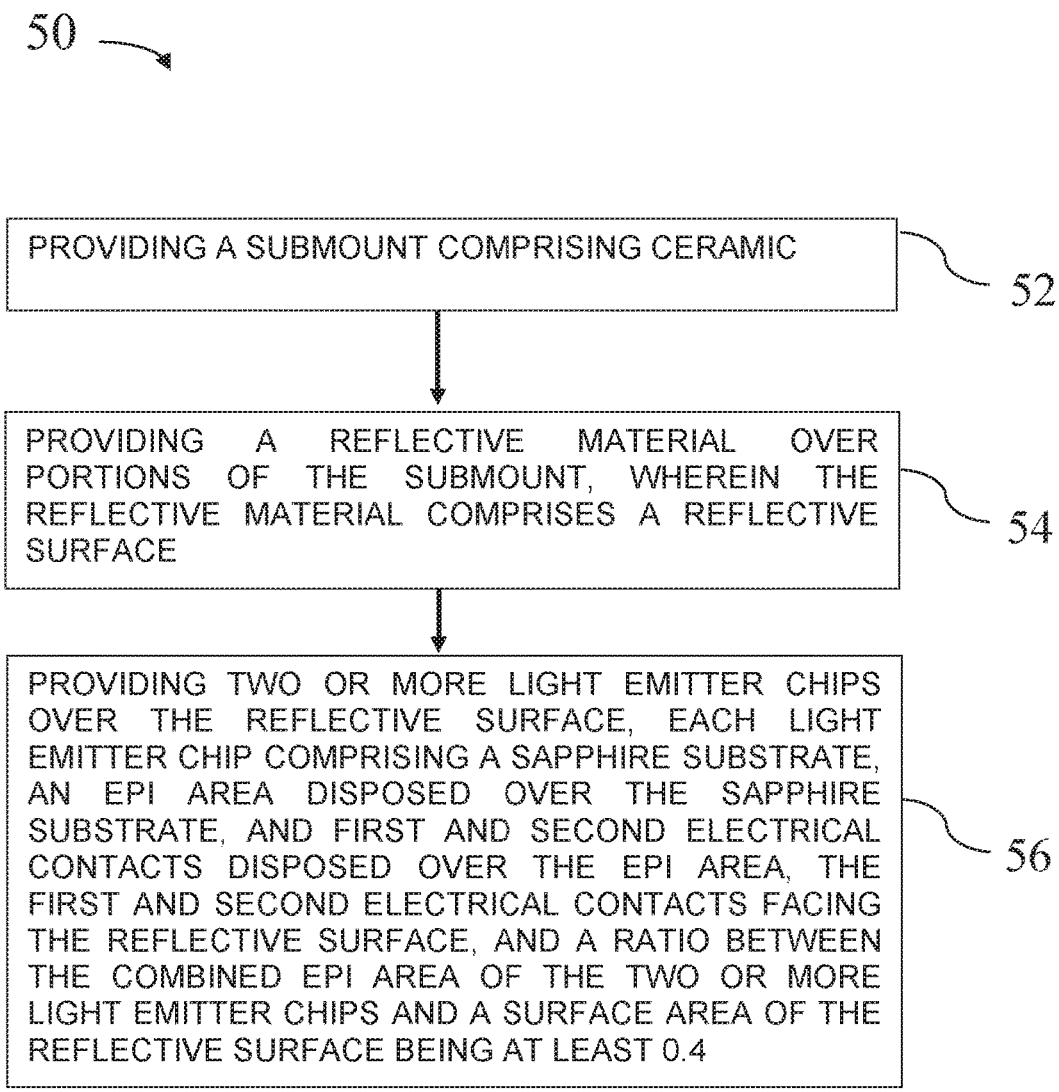
FIG. 5 is a block diagram illustrating a method relating to light emitter components according to the present subject matter.

FIG. 5 is a block diagram illustrating a method, generally designated 50, of providing a light emitter component. In block 52, a submount is provided. The submount can comprise ceramic, such as AlN.

In block 54, a reflective material is provided over portions of the submount. The reflective material can comprise a reflective surface.

In block 56, two or more light emitter chips are provided over the reflective surface. In some aspects, each light emitter chip comprises a sapphire substrate, an epi area disposed over the sapphire substrate, and first and second electrical contacts (e.g., 28A, 28B, FIG. 2B) are disposed over the epi area. The first and second electrical contacts face the reflective surface, and a ratio between the combined epi area of the two or more light emitter chips and a surface area of the reflective surface is at least 0.4. The ratio may be at least 0.5, or any number between 0.4 and 0.99.

High density multi-chip components as described herein can comprise a plurality of LED chips 14, where each LED chip 14 can be identical, or where combinations of more than one type, size, structure, color, etc., of LED chip can be used. Square and rectangular submounts 12 have been shown, but submounts of various shapes and/or sizes are contemplated herein. Submounts 12 can comprise a ceramic or ceramic-based material, a metal material, a plastic material, or combinations thereof. Various semiconductor materials can be used within LED chips 14, including sapphire.

Figure 6A:
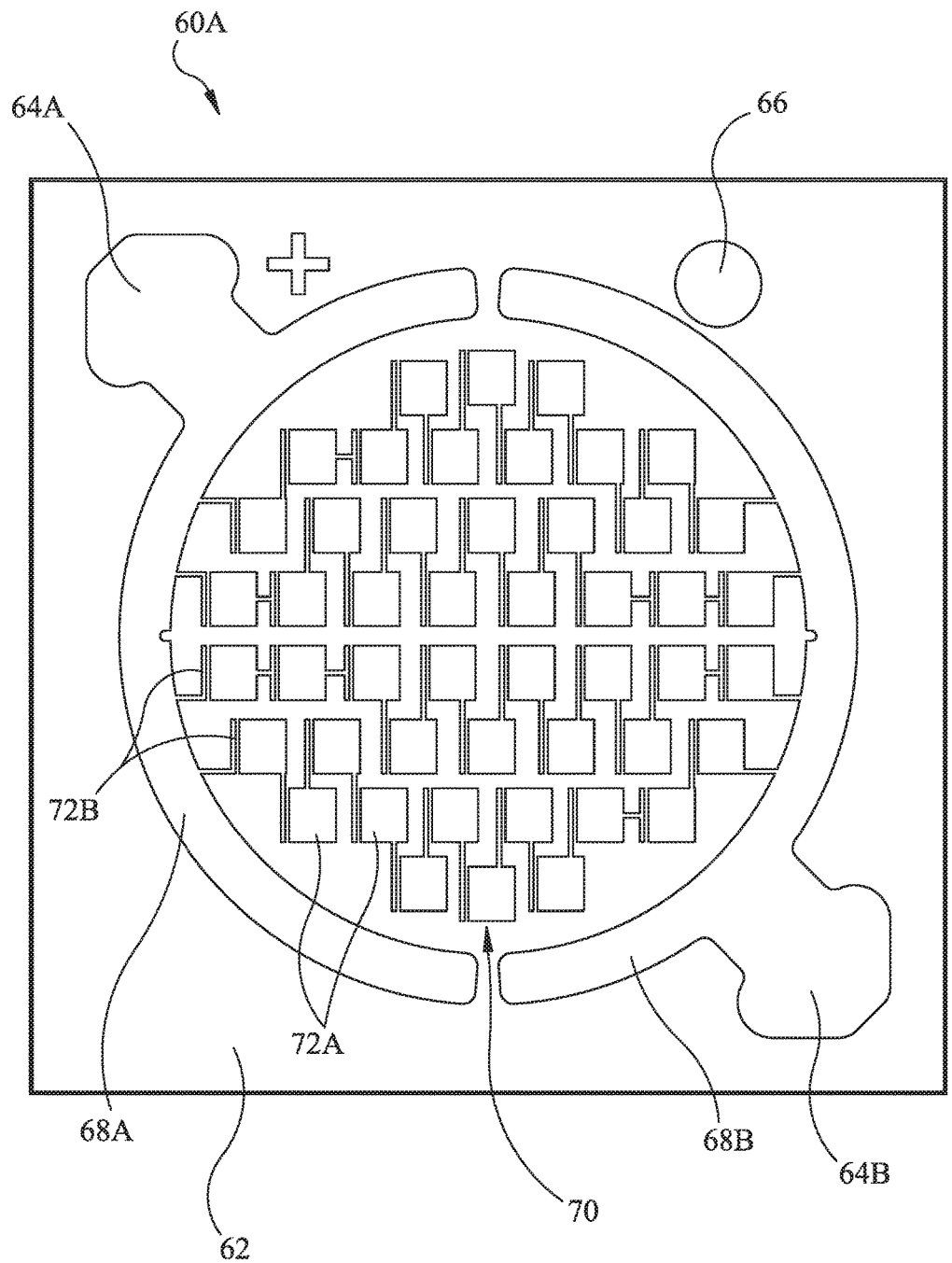
FIGS. 6A-6C are various trace designs associated with light emitter components.
Figure 6B:
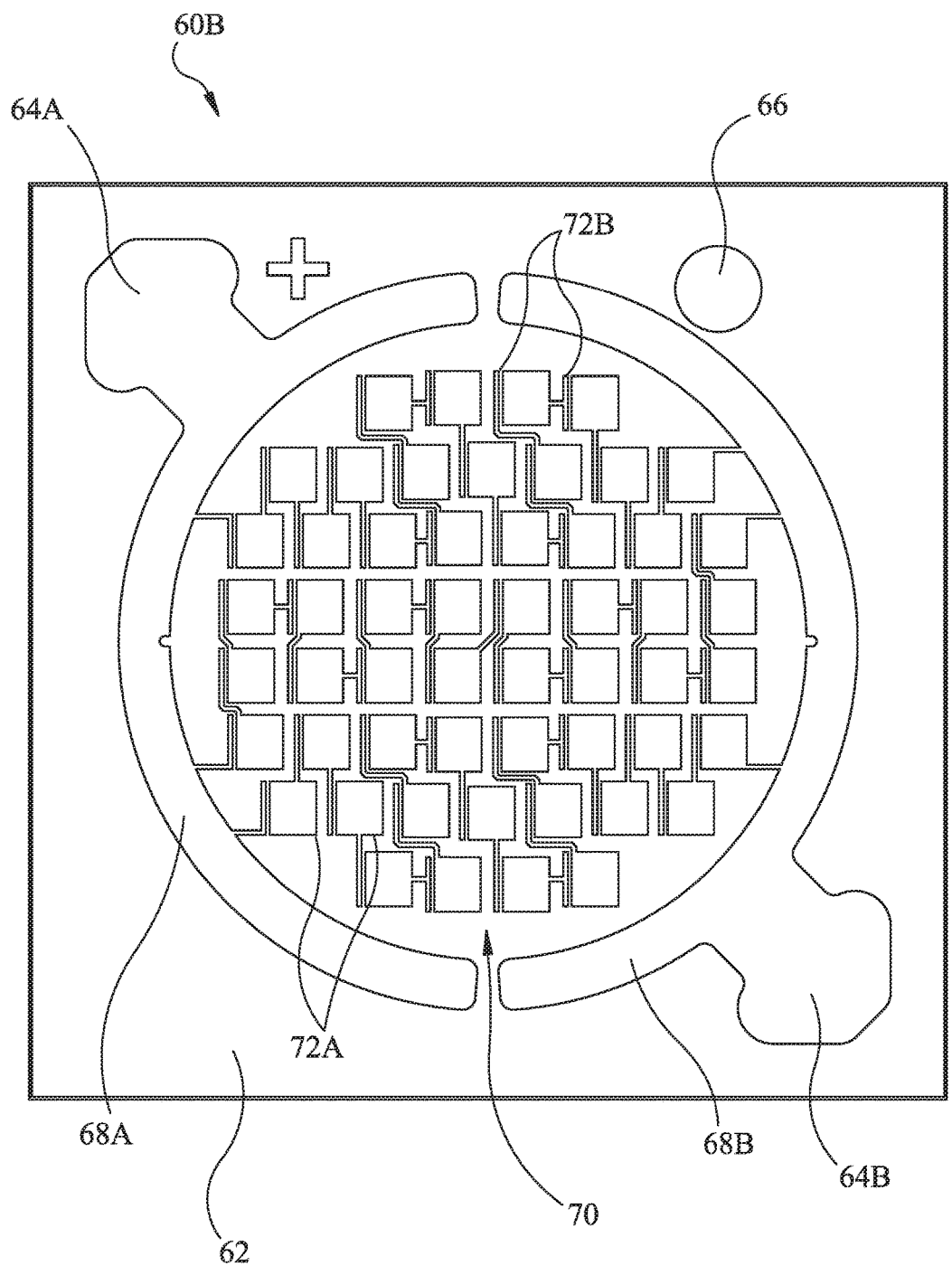
Figure 6C:
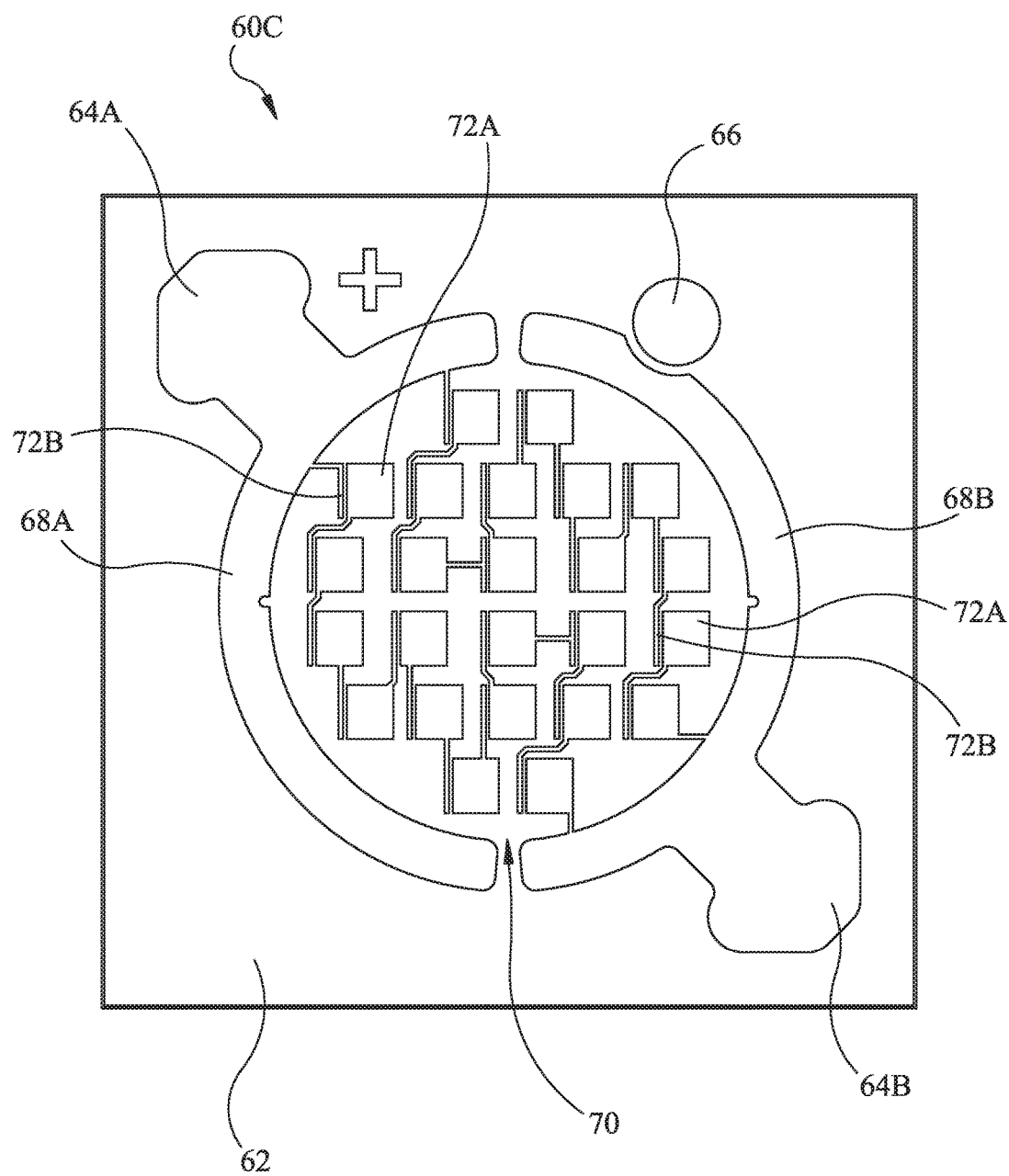

FIGS. 6A-6C are various trace layouts or designs associated with light emitter component 60A to 60C, respectively. Each component 60A to 60C can comprise a plurality of traces 70. Traces 70 can comprise a plurality of individual traces 72A and 72B of opposing electrical polarity. In some aspects, individual traces 72A and 72B can comprise a plurality of anode/cathode pairs configured to pass electrical current into a plurality of LED chips (e.g., 14, FIG. 2B). In some embodiments, individual traces 72A and 72B are configured to connect to electrical contacts (e.g., 28A, 28B, FIG. 2B) disposed on a lower surface of each LED chip (e.g., 14, FIG. 2B). Notably, individual traces 72A and 72B are provided in a high density array over submount between outermost traces 68A and 68B. A reflective material may be disposed between individual traces 72A and 72B for forming a light emitter surface (LES) that reflects light emitted by one or more LED chips.

Still referring to FIGS. 6A-6C, a plurality of traces 70 can be disposed between outermost traces 68A and 68B, which in some embodiments comprise an annular shaped anode/cathode pair. Each trace may include a thin, narrow portion that is approximately 90 μm wide, or less. Outermost traces 68A and 68B can be disposed below a retention material (e.g., 82, FIG. 8) and portions thereof may be exposed for forming uppermost electrical pads, such as solder pads 64A and 64B. Electrical current can pass into solder pads 64A and 64B via electrically conducive wires or connectors (not shown).

One or more test points or test pads 66 may also be exposed on a surface of submount 62 for testing electrical properties associated with each respective component prior to use in a lighting application (e.g., lighting bulb, fixture, or the like). LED components that incorporate arrays of LED chips and reflective surfaces between each LED chip as described herein can exhibit improved lighting aspects, for example, improved efficiency, brightness, and/or light extraction at a lower cost than conventional components.

Table 2 below provides some exemplary sizes and/or shapes associated with various dimensions illustrated in FIGS. 6A through 6C, and other examples. All area dimensions in the table below are in mm$^2$ unless otherwise specified.

TABLE 2

EXEMPLARY DIMENSIONS (APPROXIMATE)

| Component | Trace Area (mm$^2$) | Chip Area (mm$^2$) | LES Area (mm$^2$) | Trace/LES | Chip/LES % (ratio) | Trace/Chip |
|---|---|---|---|---|---|---|
| Example 1 | 0.18 | 11.90 | 16.81 | 1.05% | 70.8% (.708) | 1.48% |
| Example 2 | 0.265 | 15.87 | 28.3 | 0.94% | 56.1% (.562) | 1.67% |
| Example 3 | 0.531 | 31.74 | 63.6 | 0.83% | 49.9% (.499) | 1.67% |
| Example 4 | 1.23 | 63.48 | 113.1 | 1.08% | 56.1% (.561) | 1.93% |
| Example 5 | 1.68 | 71.42 | 113.1 | 1.49% | 63.1% (.631) | 2.35% |
| Example 6 | 3.67 | 141.1 | 283.5 | 1.29% | 49.8% (.498) | 2.60% |
| Example 7 | 1.50 | 9 | 28.3 | 5.31% | 31.8% (.318) | 16.7% |
| Example 8 | 2.87 | 15 | 63.6 | 4.51% | 23.6% (.236) | 19.1% |
| Example 9 | 2.57 | 36 | 113.1 | 2.27% | 31.8% (.318) | 7.13% |
| Example 10 | 5.55 | 72 | 283.5 | 1.96% | 25.4% (.254) | 7.71% |

As Table 2 illustrates above, emitter components 60A through 60C utilize thin, fine, and/or narrow traces, which advantageously reduces the blockage of light and increases the light extraction obtained per component. Traces 70 may occupy an area as small as approximately 0.18 mm$^2$ and/or an area up to approximately 5.55 mm$^2$ over a component, which may correspond to less than 5% of the reflective surface being occupied by the plurality of electrical traces. In some aspects, as noted in Table 2 above, less than 1% of the reflective surface (e.g., LES) is occupied by the combined trace area (see, e.g., Trace/LES values).

Further, the total (combined) chip area (i.e., a combined planar surface area of each chip) compared to an LES area (i.e., Chip/LES) may also be large, for example, and range from between at least approximately 25% and 71% (i.e., having a packing density ratio that is at least approximately 0.25 or more) so that a high density array of chips is packed over the LES. A device having this packing density can also have a ratio between a combined epi area of the plurality of light emitter chips and a surface area of the reflective surface is at least 0.4 or more (Table 1). The dense packing of chips and epi increases brightness and light extraction per component. In some embodiments, the Chip/LES ratio may be greater than 71%, for example, and may include approximately 75% or more, approximately 80% or more, approximately 90% or more, or the like.

In some aspects, a light emitter component can be provided that comprises a submount having a reflective surface (e.g., a reflective material or the like). According to Table 2, a plurality of light emitter chips can be disposed over the reflective surface, and a ration of a combined planar surface area of the plurality of light emitter chips to a planar surface area of the reflective surface is at least approximately 0.25 or more. A retention structure can be disposed around the reflective surface and the plurality of light emitter chips. The retention structure can be configured as a substantially square shape in a planar view over the submount. The ratio of the combined planar surface area of the plurality of light emitter chips to the planar surface area of the reflective surface can be at least approximately 0.5 or more or at least 0.75 or more.

Figure 7A:
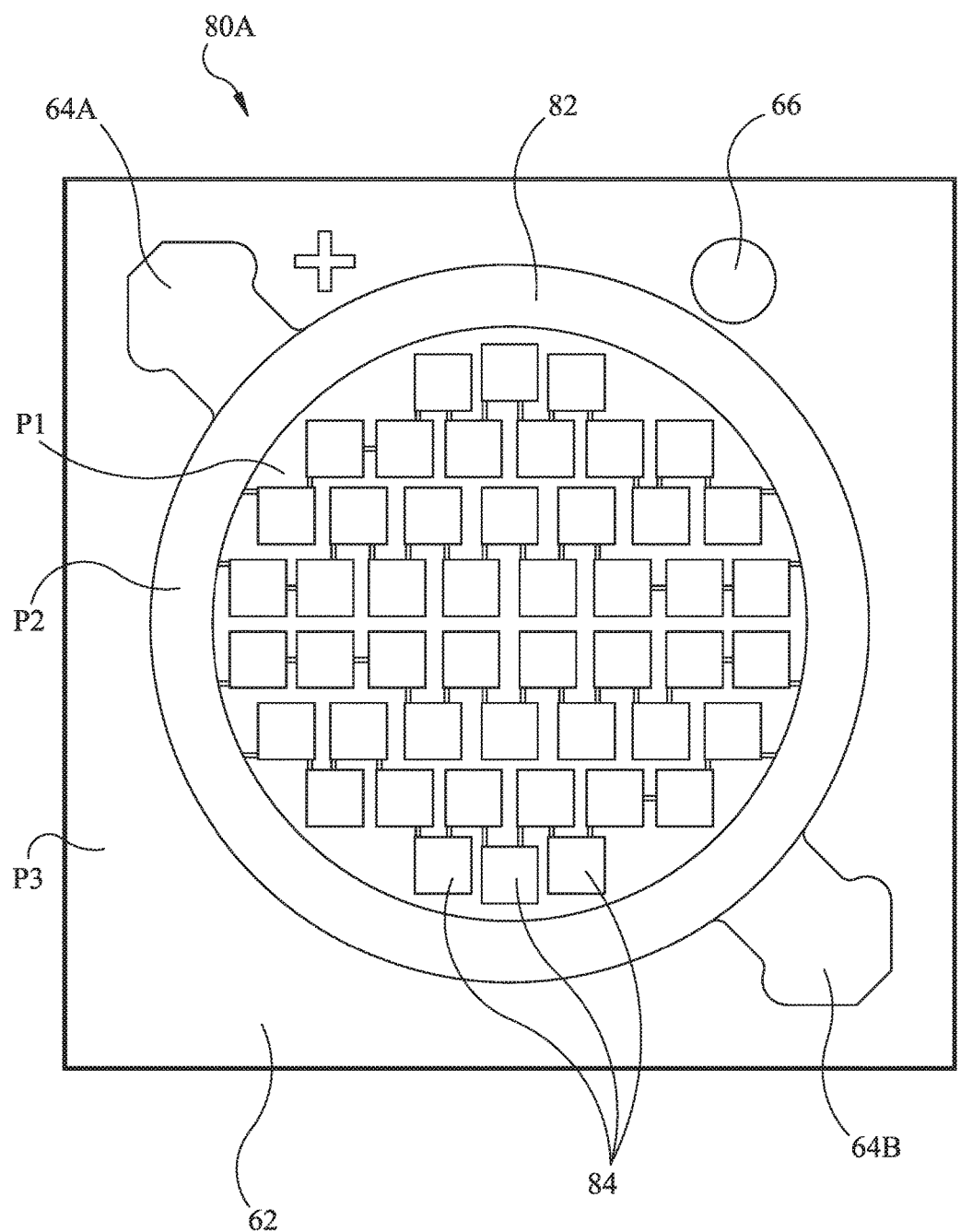
FIGS. 7A-7C are various LED chip arrangements associated with light emitter components according to the present subject matter.
Figure 7B:
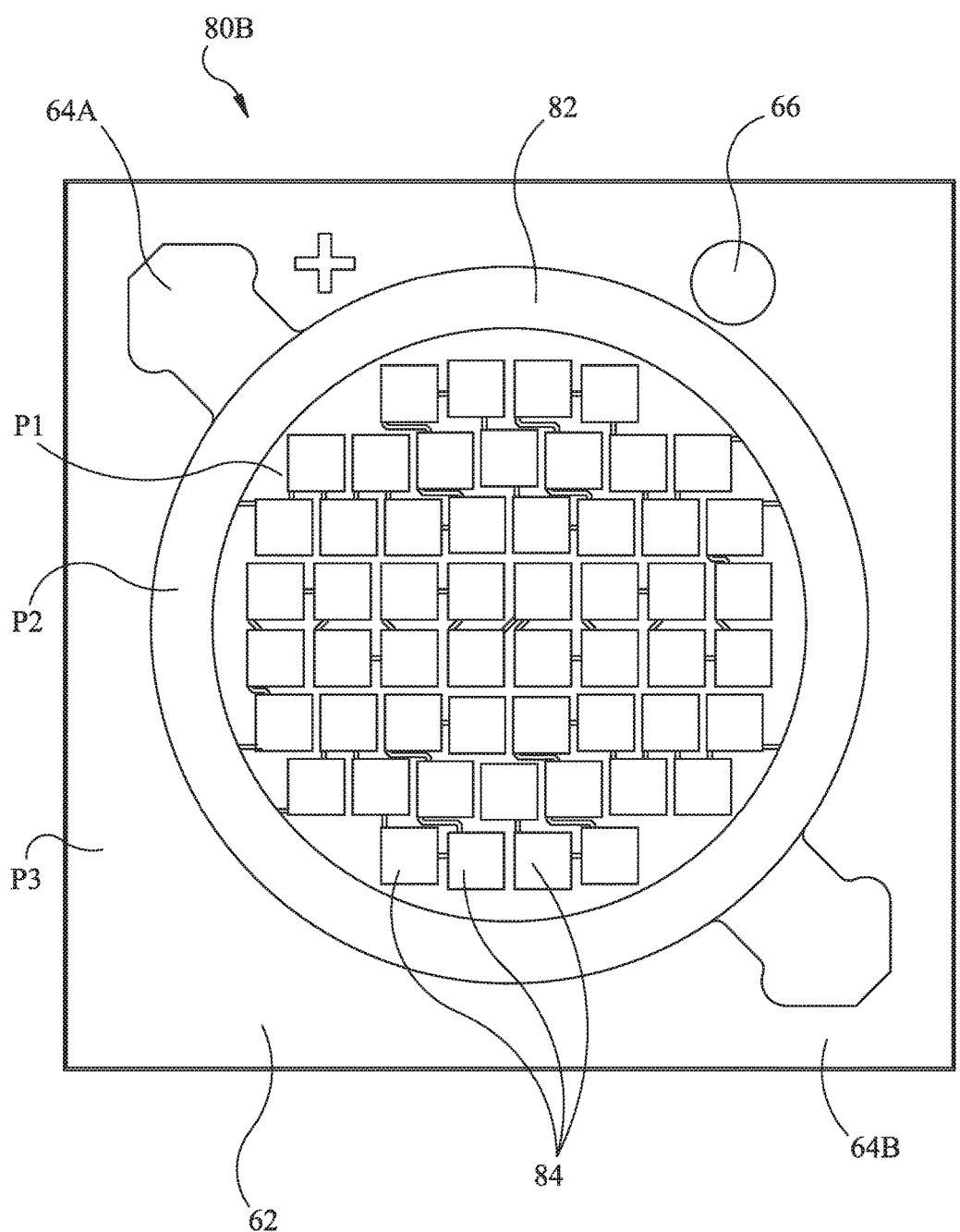
Figure 7C:
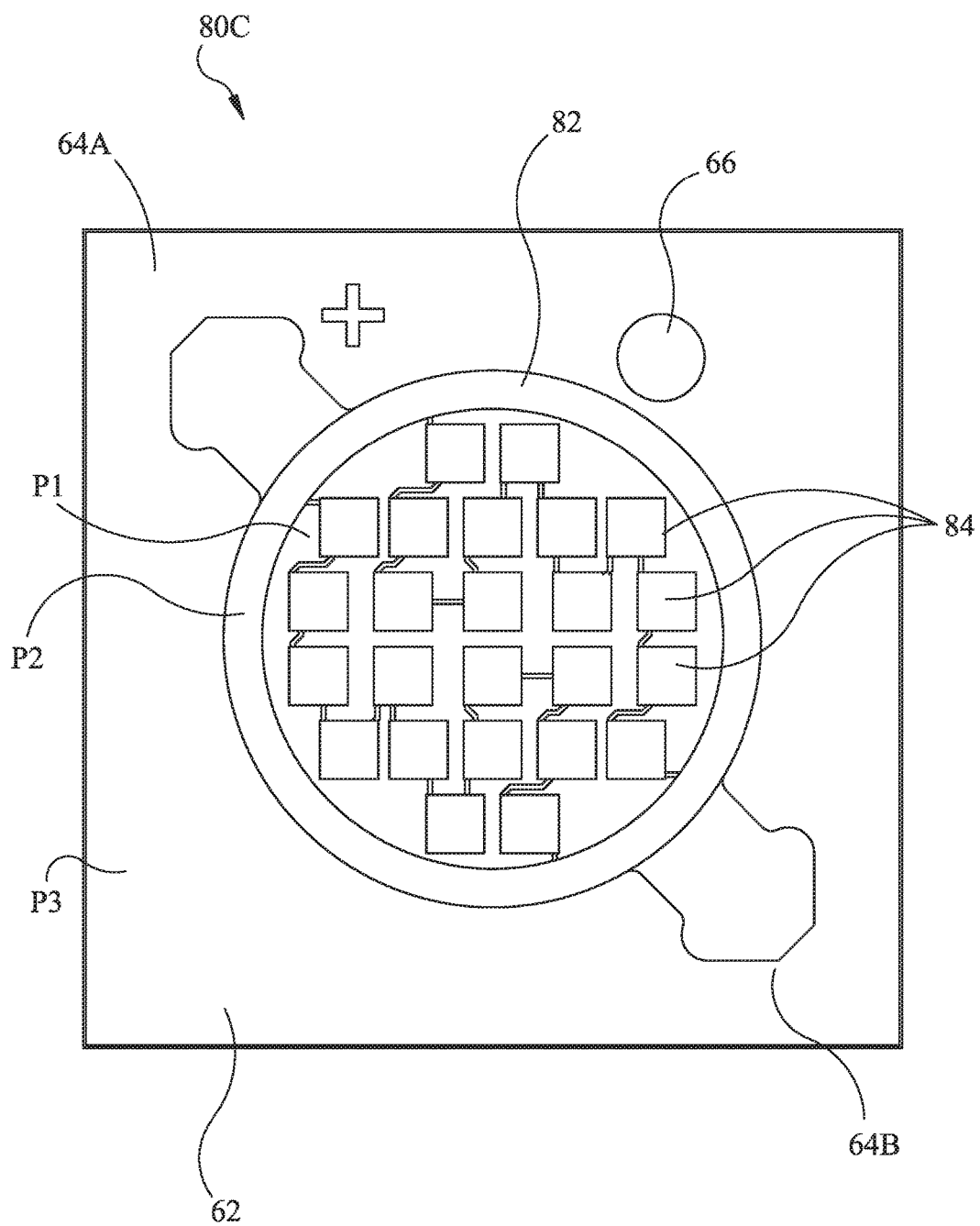

FIGS. 7A-7C are various examples of respective light emitter components 80A to 80C comprising a plurality of tightly packed LED chips 84. For example, a plurality of LED chips 84 can be die attached to individual traces 72A and 72B as shown in FIGS. 6A through 6C, respectively. Notably, LED chips 84 can attach directly to underlying traces (e.g., 72A, 72B, see FIG. 6A through 6C), which obviates the need for wires, wire bonds, or other types of wired connectors thereby resulting in tighter packing of the LED chips in an array. The tighter packing (e.g., a higher density) of LED chips 84 in an array can improve light output, reliability, and efficacy of the product incorporating the array as described herein.

In some aspects, LED chips 84 can comprise sapphire based chips, which absorb less light than silicon (Si) or silicon carbide (SiC) based LED chips. Thus, LED arrays as described herein can be more dense (i.e., tighter packed), as adjacent chips have less area (less spacing) therebetween. The tighter packing results in LED arrays that are more dense in terms of epi regions (e.g., active areas of the chips that emit light) and are tightly packed than previously thought to be achievable. A ratio between a combined epi area of the plurality of light emitter chips and a surface area of the reflective surface (e.g., reflective material disposed on and/or between traces 72A, 72B (FIG. 6A through 6C) is at least 0.4 or more, at least 0.5 or more, or in some aspects, at least 0.8 or more.

LED chips 84 can comprise square chips that are approximately 1000 μm in size, meaning that chips are approximately 1000 μm wide per side. LED chips 84 can also comprise square chips that are more or less than or approximately equal to 1000 μm (1 mm) per side, such as approximately 500 μm per side, approximately 300 μm per side, or less than approximately 300 μm per side, approximately 1.15 mm per side, approximately 1.4 mm per side, approximately 2 mm in size, or more than 2 mm in size. LED chips 84 may also be substantially rectangular and can comprise any suitable dimension, where desired. LED chips 84 can, for example, be spaced apart by a distance of approximately 10 μm, approximately 50 μm, approximately 100 μm, approximately 200 μm, or more than approximately 200 μm.

As FIGS. 7A-7C collectively illustrate, a reflective material (e.g., 16, FIGS. 1A-1E) comprising a reflective surface can be disposed on or over various portions of submount 62. In some aspects, a reflective material can be provided directly on or over and contact the ceramic submount 62. A reflective material can be provided over a first portion P1 of submount 62, a second portion P2 of submount 62, and a third portion P3 of submount 62. The first portion P1 of submount 62 may be disposed between one or more inner walls of retention material 82 and on a first side thereof. The second portion P2 of submount 62 may be disposed below portions of retention material 82. That is, a reflective material may coat surfaces of submount 62 that are disposed below retention material 82, so that the reflective material contacts both the submount 62 and retention material 82. A third portion P3 of submount 62 which may be coated with a reflective material is disposed in regions outside of retention material 82, on a second side of retention wall that opposes first portion P1. The reflective material coats surfaces of submount 62, which are disposed between outermost edges of submount and an outer wall of retention material 82. The reflective coating disposed over first, second, and third portions P1 to P3 can comprise a white reflective polymer, a metal, ceramic, and/or a reflective solder mask material. It is also envisioned that in some embodiments the reflective material can not be over or cover some of the features. For example, one or more portions of the electrical traces can be uncovered by the reflective material.

Figure 8:
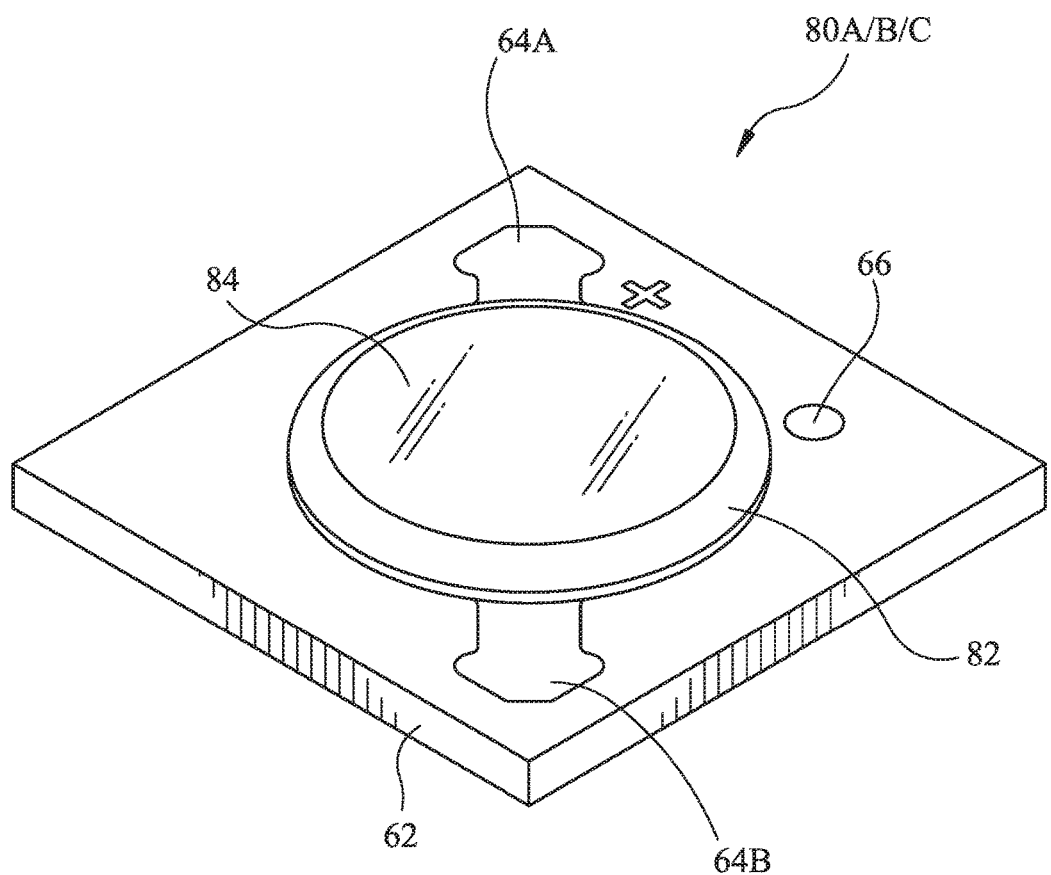
FIG. 8 is a perspective view of a light emitter component according to the present subject matter.

FIG. 8 is a perspective view of a light emitter component 90 according to the present subject matter. Light emitter component 90 can comprise an encapsulant or filling material 86 disposed over LED chips (e.g., 84, FIGS. 7A through 7C). A retention material 82 can be disposed over outermost traces (e.g., 68A, 68B, FIGS. 6A through 6C) for retaining filling material 86. Filling material 86 can comprise an optional wavelength conversion material (e.g., phosphor).

Adjacent LED chips 84 can be uniformly or non-uniformly disposed over submount with respect to LES. Adjacent LED chips 84 may be spaced apart by a distance of at least approximately 10 μm or more. In other aspects, adjacent solid state light emitters can be spaced apart, for example, by a distance of at least approximately 25 μm or more, 50 μm or more, 100 μm or more, or the like. Spacing of LED chips 84 can also differ between different portions of the light emission area. For example, a central portion of the light emission area can comprise at least one predetermined group of LED chips that may be spaced apart differently than LED chips in a peripheral portion of the light emission surface or area. An example of light emitter component having uniformly and non-uniformly spaced chips, and chip spacing in general, is discussed by way of example in U.S. patent application Ser. No. 14/961,470, the disclosure of which is incorporated by reference herein in the entirety. The chip spacing and packing density are improved for increasing the amount of light extracted per component.

Where multiple chips are used or provided over a submount and between traces, the LED chips can be disposed proximate a center of the submount and/or distributed across at least 40%, 50%, 60%, or more than 70% of the surface area of submount. The LED chips can be provided at equal distances from each other, or randomly spaced apart. The LED chips may be spaced apart from each other by at least approximately 10 μm or more and spaced apart from the traces by at least a distance of at least approximately 100 μm or more. An example of a light emitter component having improved packing density by virtue of the spacing between adjacent chips and the spacing between chips and traces is discussed by way of example in U.S. patent application Ser. No. 14/292,331, the disclosure of which is incorporated by reference herein in the entirety. The chip spacing and packing density is improved for increasing the amount of light extracted per component.

The components, trace layouts, and LED chip layouts illustrated in FIGS. 1B through 1E, 4A through 4G, and 6A to 8 are exemplary light emitter components comprising high-density, efficient components provided in part by obviating wire bonds and minimizing spacing between adjacent chips. The reflective coatings and surfaces described herein can also advantageously minimize light absorption by the submount, and improve light output.

While the subject matter has been has been described herein in reference to specific aspects, features, and illustrative embodiments, it will be appreciated that the utility of the subject matter is not thus limited, but rather extends to and encompasses numerous other variations, dimensions, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing LED lighting components; improved efficiency; improved color rendering; improved light extraction; improved ease of manufacture; improved color uniformity and mixing; improved brightness; and/or improved thermal management.

Various combinations and sub-combinations of the structures and features described herein are contemplated and will be apparent to a skilled person having knowledge of this disclosure. Any of the various features and elements as disclosed herein can be varied, modified, and/or combined with one or more other disclosed features and elements unless indicated to the contrary. Correspondingly, the subject matter as hereinafter claimed is intended to be broadly construed and interpreted, as including all such variations, modifications and alternative embodiments, within its scope and including equivalents of the claims.

What is claimed is:

1. A light emitter component comprising:
    a submount comprising ceramic;
    a reflective material disposed on portions of the submount, wherein the reflective material comprises a reflective surface; and
    a plurality of light emitter chips disposed on the reflective surface of the reflective material and in contact with one or more electrical traces on the submount, wherein the reflective surface extends below each of the plurality of light emitter chips and between each of the one or more electrical traces, wherein each light emitter chip comprises a sapphire substrate, an epi area disposed over the sapphire substrate, and first and second electrical contacts that face the reflective surface;
    wherein a ratio of a combined epi area of the plurality of light emitter chips to a surface area of the reflective surface not covered by the plurality of light emitter chips is at least 0.4 or more, and
    wherein a ratio of a combined planar surface area of the plurality of light emitter chips to a planar surface area of the reflective surface not covered by the plurality of light emitter chips is at least approximately 0.25 or more.

2. The component of claim 1, further comprising a retention wall disposed around the plurality of light emitter chips.

3. The component of claim 2, wherein the reflective material is disposed on a first portion of the submount that is on a first side of the retention wall, a second portion of the submount that is on a second side of the retention wall, and a third portion of the submount that is below the retention wall.

4. The component of claim 1, wherein the ceramic comprises aluminum nitride (AlN).

5. The component of claim 1, wherein the reflective material extends to outermost edges of the submount.

6. The component of claim 1, wherein at least 75% of a planar surface of the submount is covered with the reflective material.

7. The component of claim 1, wherein the reflective material comprises a reflective plastic, a reflective polymer, reflective particles, and/or a solder mask material.

8. The component of claim 1, wherein the light emitter chips are spaced apart by a distance of approximately 0.3 millimeters (mm) or less.

9. The component of claim 1, further comprising a plurality of electrical traces disposed on the submount, wherein each of the electrical traces comprises a width of approximately 90 μm or less.

10. The component of claim 1, wherein the light emitter chips are encapsulated in silicone.

11. A light emitter component comprising:
    a submount comprising ceramic;
    a reflective material disposed on the submount;
    a plurality of light emitter chips disposed on the reflective material and in contact with one or more electrical traces on the submount, wherein the reflective material extends below each of the plurality of light emitter chips and between each of the one or more electrical traces; and
    a retention wall disposed around the plurality of light emitter chips wherein the reflective material is disposed over:
        a first portion of the submount that is on a first side of the retention wall;
        a second portion of the submount that is on a second side of the retention wall; and
        a third portion of the submount that is below the retention wall such that the reflective material contacts portions of the submount and the retention wall,
    wherein the reflective material comprises a reflective surface, and wherein the plurality of light emitter chips disposed on and covering at least a portion of the reflective material occupies approximately 50% or more of a surface area of the reflective surface of the reflective material.

12. The component of claim 11, wherein the plurality of light emitter chips occupies approximately 70% or more of a surface area of the reflective surface.

13. The component of claim 11, wherein the ceramic comprises aluminum nitride (AlN).

14. The component of claim 11, wherein the reflective material extends to outermost edges of the submount.

15. The component of claim 11, wherein at least 75% of a planar surface of the submount is covered with the reflective material.

16. The component of claim 11, further comprising a plurality of electrical traces that are configured to electrically communicate with the plurality of light emitter chips, wherein less than 5% of a planar surface area of the reflective surface is occupied by the plurality of electrical traces.

17. The component of claim 11, wherein the reflective material comprises a reflective plastic, a reflective polymer, reflective particles, or a solder mask material.

18. The component of claim 11, wherein the light emitter chips are spaced apart by a distance of approximately 0.3 millimeters (mm) or less.

19. A light emitter component comprising:
    a submount comprising a reflective surface;
    a plurality of light emitter chips disposed on the reflective surface and in contact with one or more electrical traces on the submount, wherein the reflective surface extends below each of the plurality of light emitter chips and between each of the one or more electrical traces, wherein each of the plurality of light emitter chips comprises a sapphire substrate, and wherein a ratio of a combined planar surface area of the plurality of light emitter chips to a planar surface area of the reflective surface not covered by the plurality of light emitter chips is at least approximately 0.25 or more; and
    a retention structure disposed around the reflective surface and the plurality of light emitter chips, wherein the retention structure is configured as a substantially square shape in a planar view over the submount.

20. The component of claim 19, wherein the reflective surface comprises a reflective material that is disposed on a first portion of the submount that is on a first side of the retention structure, a second portion of the submount that is on a second side of the retention structure, and a third portion of the submount that is below the retention structure.

21. The component of claim 19, wherein the submount comprises aluminum nitride (AlN).

22. The component of claim 19, wherein a ratio of the combined planar surface area of the plurality of light emitter chips to the planar surface area of the reflective surface is at least approximately 0.5 or more.

23. The component of claim 19, wherein the ratio of the combined planar surface area of the plurality of light emitter chips to the planar surface area of the reflective surface is at least approximately 0.75 or more.

* * * * *